United States Patent [19]

Muraki

[11] Patent Number: 5,905,267
[45] Date of Patent: *May 18, 1999

[54] ELECTRON BEAM EXPOSURE APPARATUS AND METHOD OF CONTROLLING SAME

[75] Inventor: Masato Muraki, Inagi, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/873,016

[22] Filed: Jun. 11, 1997

[30] Foreign Application Priority Data

Jun. 12, 1996 [JP] Japan .................................. 8-150984
Mar. 14, 1997 [JP] Japan .................................. 9-060855

[51] Int. Cl.$^6$ .......................... H01J 37/302; H01L 21/027
[52] U.S. Cl. ............................... 250/492.22; 250/492.23
[58] Field of Search ......................... 250/492.22, 492.23, 250/492.2, 398

[56] References Cited

U.S. PATENT DOCUMENTS

| | | | |
|---|---|---|---|
| 4,130,761 | 12/1978 | Matsuda | 250/492 |
| 4,132,898 | 1/1979 | Buelow et al. | 250/492.22 |
| 4,370,554 | 1/1983 | Bohlen et al. | 250/491.1 |
| 4,724,328 | 2/1988 | Lischke | 250/492.2 |
| 4,812,662 | 3/1989 | Goto et al. | 250/491.1 |
| 4,980,567 | 12/1990 | Yasuda et al. | 250/398 |
| 5,260,579 | 11/1993 | Yasuda et al. | 250/492.2 |
| 5,422,491 | 6/1995 | Sakamoto | 250/492.22 |

*Primary Examiner*—Jack I. Berman
*Attorney, Agent, or Firm*—Fitzpatrick, Cella, Harper & Scinto

[57] ABSTRACT

A multi-electronic beam electron beam exposure apparatus in which the patterns exposed by electron beams can be connected with a high degree of reliability. An electron beam exposure method includes steps of causing a plurality of electron beams to impinge upon a substrate at positions that differ from one another, deflecting each electron beam in an element exposure area of each electron beam, wherein the element exposure area is decided by a deflector of the electron beams, and individually controlling irradiation of the substrate by the electron beams, whereby a pattern is exposed in a plurality of the element exposure areas on the substrate. The method further includes a step of controlling the plurality of electron beams by the deflector in such a manner that exposure areas overlap at portions where the element exposure areas are contiguous.

32 Claims, 20 Drawing Sheets

FLOWCHART OF SEMICONDUCTOR DEVICE MANUFACTURE

WAFER PROCESS

ELECTRON BEAM EXPOSURE APPARATUS AND METHOD OF CONTROLLING SAME

BACKGROUND OF THE INVENTION

This invention relates to an electron beam exposure apparatus and method of controlling the same. More particularly, the invention relates to an electron beam exposure apparatus for drawing a pattern on a wafer directly or on a mask or reticle using a plurality of electron beams, a method of controlling the apparatus, the associated control program and a method of manufacturing a device using this electron beam exposure apparatus.

Examples of electron beam exposure apparatuses include an apparatus of the point beam type which uses a beam in the shape of a spot, an apparatus of the variable rectangular beam type which uses a beam in the shape of a rectangular cross section, and an apparatus of the stencil mask type which uses a beam given a desired cross sectional shape through the use of a stencil mask.

The electron beam exposure apparatus of the point beam type is used exclusively for research and development purposes because of its low throughput. Though the electron beam exposure apparatus of the variable rectangular beam type has a throughput higher than that of the apparatus of the point beam type by one to two orders, many problems remain in terms of throughput when it is attempted to expose a pattern consisting of fine patterns on the order of 0.1 $\mu$m integrated to a high degree. On the other hand, the electron beam exposure apparatus of the stencil mask type uses a stencil mask in which a plurality of repetitive pattern through-holes are formed at a portion thereof that corresponds to a variable rectangular aperture. As a result, the electron beam exposure apparatus of stencil mask type is highly advantageous when exposing repetitive patterns. However, in the case of a semiconductor circuit that requires a multiplicity of transfer patterns that will not fit on a single stencil mask, it is necessary to produce a plurality of stencil masks in advance and use them by extracting them one at a time. Since changing masks takes time, a problem that arises is a very low throughput.

An apparatus which solves this problem is a multi-electron beam exposure apparatus which irradiates the surface of a sample with a plurality of electron beams along design coordinates of the surface, scans the plurality of electron beams across the sample surface by deflecting the electron beams along the design coordinates, and turns the plurality of electron beams on and off individually in conformity with the pattern to be drawn, thereby drawing the pattern on the surface. A feature of the multi-electron beam exposure apparatus is that throughput can be improved owing to the ability to draw any pattern without using a stencil mask.

FIG. 18A illustrates the general arrangement of the multi-electron beam exposure apparatus. The apparatus includes electron guns 501a, 501b, 501c whose electron beams can be turned on and off individually, a reduction electron optical system 502 for reducing the diameters of the plurality of electron beams and projecting the beams upon a wafer 503, and a deflector 504 for scanning the plurality of projected electron beams of reduced diameter across the wafer 503.

As shown in FIG. 18B, electron beams B1, B2, B3 from the electron guns 501a, 501b, 501c, respectively, are deflected equal amounts by the deflector 504. As a result, with the respective beam reference positions serving as the reference, the electron beams are moved while their positions on the wafer are set successively in accordance with arrays (element exposure areas) decided by the deflector 504. More specifically, FIG. 18B shows the manner in which patterns to be exposed are exposed in accordance with identical arrays. Each of the electron beams is moved while its position is set in such a manner that the positions on the arrays at identical times become (1,1), (1,2), ... (1,16), (2,1), (2,2), (2,16), (3,1). Here element exposure areas ES1, ES2, ES3 exposed by respective ones of the electron beams are decided by the deflector 504, with the element exposure areas being contiguous. By deflecting the electron beams and controlling irradiation by the electron beams, patterns (P1, P2, P3) to be exposed are exposed in the respective element exposure areas.

There are instances where it is attempted to expose a continuous pattern P0 of the kind shown in FIG. 18B composed of the patterns P1, P2, P3 exposed by the electron beams B1, B2, B3. However, there are occasions where the element exposure areas ES1, ES2, ES3 are not contiguous and move apart from each other, as shown in FIG. 18C, owing to the deflection precision of the deflector 504 or a change in the reduction electron optical system 502 with the passage of time. As a result, the pattern P0, which is to be continuous, is exposed upon being split up into non-contiguous patterns P1, P2, P3. Consequently, in a semiconductor device manufactured from a wafer on which such a pattern has been exposed, the desired operation cannot be achieved owing to severing of wiring, and there is a pronounced decline in the yield of the semiconductor device manufacturing process.

SUMMARY OF THE INVENTION

An object of the present invention is to assure the connection of patterns exposed by a plurality of electron beams.

According to the present invention, the foregoing object is attained by providing an electron beam exposure apparatus comprising a plurality of electron beam sources for irradiating a substrate with electron beams, displacing means for displacing irradiation positions of the electron beams which irradiate the substrate, and irradiation control means for individually controlling the irradiation of the substrate by the plurality of electron beams, the displacing means displacing the irradiation position of each electron beam in such a manner that a peripheral portion of an element exposure area corresponding to each electron beam source will overlap a peripheral portion of another element exposure area contiguous thereto.

In a preferred embodiment, the displacing means includes deflecting means for deflecting the electron beam, which irradiates the substrate, from each electron beam source.

In a preferred embodiment, the element exposure areas are rectangular in shape and the displacing means scans the interior of each element exposure area by the corresponding electron beam.

In a preferred embodiment, the element exposure areas are rectangular in shape and the deflecting means deflects each electron beam in such a manner that the interior of each element exposure area is scanned by the corresponding electron beam.

In a preferred embodiment, the irradiation control means controls, in dependence upon the number of overlapping element exposure areas, an amount of irradiation by the electron beam from each electron beam source that corresponds to each element exposure area, this control being performed at an overlap area in which two or more element exposure areas overlap.

In a preferred embodiment, the irradiation control means controls an amount of irradiation by the electron beam from each electron beam source that corresponds to each element exposure area in dependence upon the distance from a boundary of the particular element exposure area, this control being performed at an overlap area in which element exposure areas overlap.

In a preferred embodiment, the width of an overlap area in which the peripheral portion of an element exposure area overlaps the peripheral portion of another element exposure area is decided based upon displacement accuracy of the displacing means.

In a preferred embodiment, the deflecting means includes main deflecting means for deflecting each electron beam in such a manner that subfields are changed over in successive fashion, wherein a subfield is an exposure area constructed by joining a plurality of element exposure areas, and auxiliary deflecting means for deflecting each electron beam in such a manner that the interior of each element exposure area constructing a subfield is scanned by the corresponding electron beam, wherein whenever exposure of a subfield that is the object of the exposure is finished, a changeover to the next subfield is performed by the main deflecting means and this subfield is exposed, whereby all exposure areas on the substrate are exposed.

In a preferred embodiment, the width of an overlap area in which an element exposure area situated at the outer periphery of a subfield overlaps an element exposure area situated at the outer periphery of another subfield is larger than the width of an overlap area at which element exposure areas overlap each other within a subfield.

In a preferred embodiment, the irradiation control means controls, in dependence upon the number of overlapping element exposure areas, an amount of irradiation by the electron beam from each electron beam source that corresponds to each element exposure area, this control being performed at an overlap area in which two or more element exposure areas overlap.

In a preferred embodiment, the irradiation control means controls an amount of irradiation by the electron beam from each electron beam source that corresponds to each element exposure area in dependence upon the distance from a boundary of the particular element exposure area, this control being performed at an overlap area in which element exposure areas overlap.

In a preferred embodiment, the apparatus further comprises generating means for generating exposure control data, which individually controls exposure of each element exposure area, based upon pattern data describing a pattern to be exposed on the substrate, exposure being controlled by supplying the exposure control data to the displacing means and the irradiation control means.

In a preferred embodiment, the generating means generates the exposure control data upon partitioning the pattern into element exposure areas, based upon pattern data, in such a manner that element exposure areas will have overlapping areas.

According to another aspect of the present invention, the foregoing object is attained by providing a computer readable program for controlling an electron beam exposure apparatus having a plurality of electron beam sources for irradiating a substrate with electron beams, and displacing means for displacing irradiation positions of the electron beams which irradiate the substrate, the program comprising an irradiation control step of individually controlling the irradiation of the substrate by the plurality of electron beams, and a displacement control step of causing the displacing means to displace the irradiation position of each electron beam in such a manner that a peripheral portion of an element exposure area corresponding to each electron beam source will overlap a peripheral portion of another element exposure area contiguous thereto.

In a preferred embodiment, the program further comprises a generating step of generating exposure control data, which individually controls exposure of each element exposure area, based upon pattern data describing a pattern to be exposed on the substrate, exposure being controlled by supplying the exposure control data to the displacement control step and the irradiation control step.

In a preferred embodiment, the exposure control data is generated at the generating step by partitioning the pattern into element exposure areas, based upon pattern data, in such a manner that element exposure areas will have overlapping areas.

In another aspect of the present invention, the foregoing object is attained by providing a computer readable program for generating exposure control data for controlling an exposure operation by an electron beam exposure apparatus having a plurality of electron beam sources for irradiating a substrate with electron beams, displacing means for displacing irradiation positions of the electron beams which irradiate the substrate, and irradiation control means for individually controlling the irradiation of the substrate by the plurality of electron beams, the program comprising a step of entering parameter data describing a pattern to be exposed on the substrate, and a step of generating exposure control data for partitioning a pattern into element exposure areas and individually controlling exposure of each of the element exposure areas.

The above-described electron beam exposure apparatus, a method of controlling the same or an electron beam exposure apparatus controlled based upon a control program are ideal for manufacturing devices.

Further objects, features and advantages of the present invention will become apparent from the following detailed description of embodiments of the present invention with reference to the accompanying drawings.

DESCRIPTION OF THE PREFERRED EMBODIMENTS (First Embodiment)

[Constituting Elements of Electron Beam Exposure Apparatus]

Figure 1:
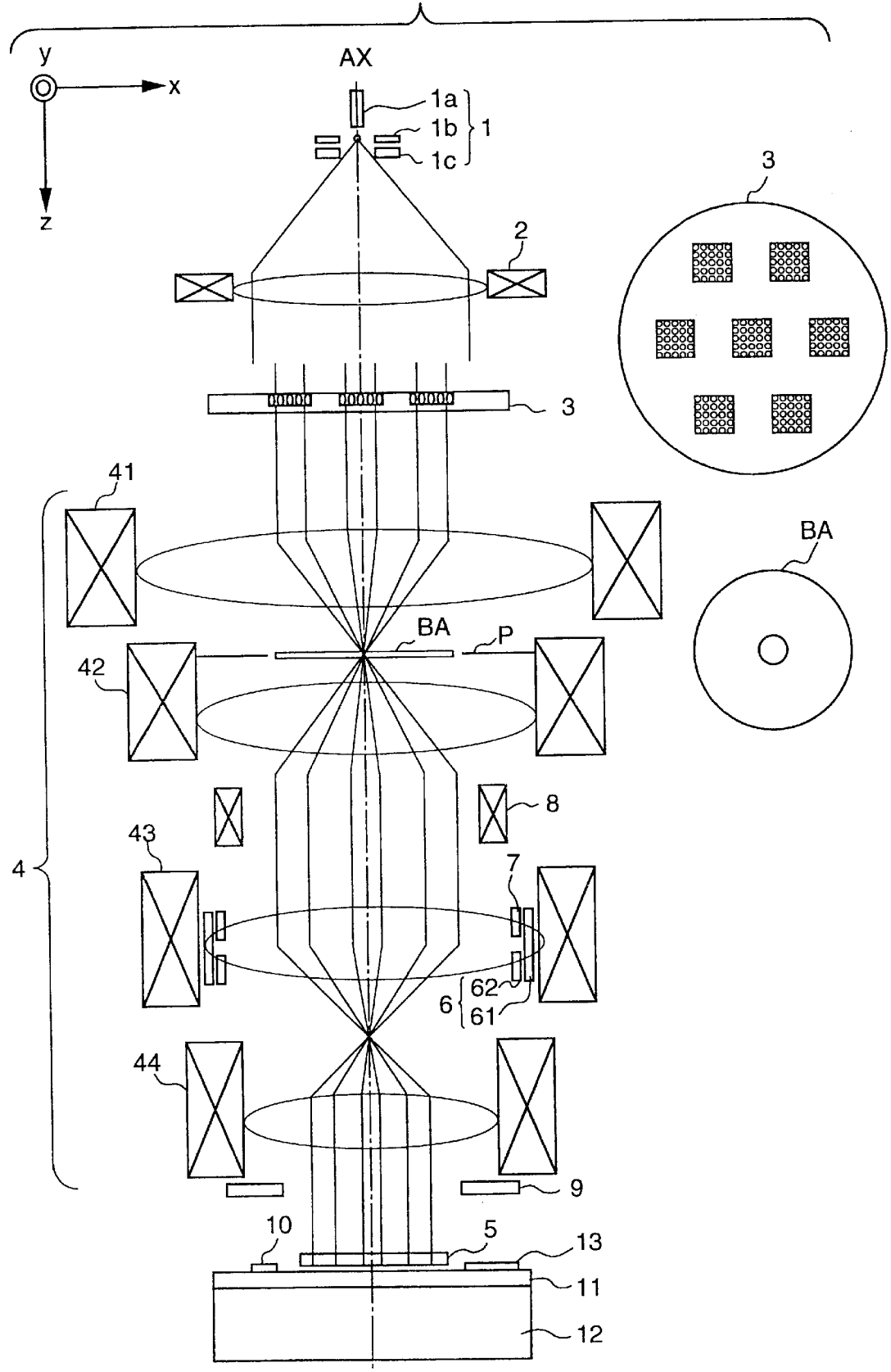
FIG. 1 is a diagram illustrating the principal components of an electron beam exposure apparatus according to the present invention.

FIG. 1 is a schematic view showing a principal part of an electron beam exposure apparatus according to the present invention.

Referring to FIG. 1, reference numeral 1 denotes an electron gun constituted by a cathode 1a, a grid 1b, and an anode 1c. Electrons emitted by the cathode 1a form crossover images between the grid 1b and the anode 1c. These crossover images will be referred to as a "source" hereinafter.

Electrons coming from the source are converted into nearly collimated electron beams by a condenser lens 2, the front-side focal point position of which is located at the source position. The nearly parallel electron beams enter an element electron optical system array 3. The element electron optical system array 3 is formed by arranging a plurality of element electron optical systems each made up of a blanking electrode, aperture, and electron lens, in a direction perpendicular to an optical axis AX. The element electron optical system array 3 will be described in detail later.

The element electron optical system array 3 forms a plurality of intermediate images of the source. The individual intermediate images are projected in a reduced scale by a reduction electron optical system 4, thus forming source images on a wafer 5.

In this case, the elements of the element electron optical system array 3 are set so that the interval between adjacent source images on the wafer 5 equals an integer multiple of the size of each source image. Furthermore, the element electron optical system array 3 varies the positions, in the optical axis direction, of the intermediate images in correspondence with the curvature of field of the reduction electron optical system 4, and corrects in advance aberrations produced upon projecting the intermediate images onto the wafer 5 in the reduced scale by the reduction electron optical system 4.

The reduction electron optical system 4 comprises a symmetric magnetic doublet made up of a first projection lens 41 (43) and second projection lens 42 (44). If f1 represents the focal length of the first projection lens 41 (43) and f2 represents the focal length of the second projection lens 42 (44), the distance between these two lenses is f1+f2. The object point on the optical axis AX matches the focal point position of the first projection lens 41 (43), and its image point is formed at the focal point of the second projection lens 42 (44). This image is reduced to −f2/f1. Since two lens magnetic fields are set to act in opposite directions, Seidel's aberrations except for Seidel's five aberrations, i.e., spherical aberration, isotropic astigmatism, isotropic coma, curvature of field, on-axis chromatic aberration, and chromatic aberrations associated with rotation and magnification are canceled.

Reference numeral 6 denotes a deflector for deflecting a plurality of electron beams from the element electron optical system array 3 to displace the plurality of source images on the wafer 5 by nearly equal displacement amounts in the X- and Y-directions. The deflector 6 is made up of a main deflector 61 used when the deflection width is large, and a sub deflector 62 used when the deflection width is small. The main deflector 61 comprises an electromagnetic deflector, and the sub deflector 62 comprises an electrostatic deflector.

Reference numeral 7 denotes a dynamic focusing coil for correcting errors of the focusing positions of the source images caused by deflection errors produced upon activating the deflector 6; and 8, a dynamic stigmatic coil for correcting astigmatism of deflection errors produced upon deflection as in the dynamic focusing coil 7.

Reference numeral 9 denotes a reflected electron detector for detecting reflected electrons or secondary electrons produced when the electron beams from the element electron optical system array 3 are irradiated onto alignment marks formed on the wafer 5 or marks on a stage reference plate 13.

Reference numeral 10 denotes a Faraday cup having two single knife edges extending in the X- and Y-directions. The Faraday cup 10 detects the charge amount of the source image formed by the electron beam from each element electron optical system.

Reference numeral 11 denotes a q-Z stage which carries the wafer, and is movable in the direction of the optical axis AX (Z-axis) and in the rotation direction about the Z-axis. The above-mentioned stage reference plate 13 and the Faraday cup 10 are fixed on the q-Z stage 11.

Reference numeral 12 denotes an X-Y stage which carries the q-Z stage, and is movable in the X- and Y-directions perpendicular to the optical axis AX (Z-axis).

Figure 2:
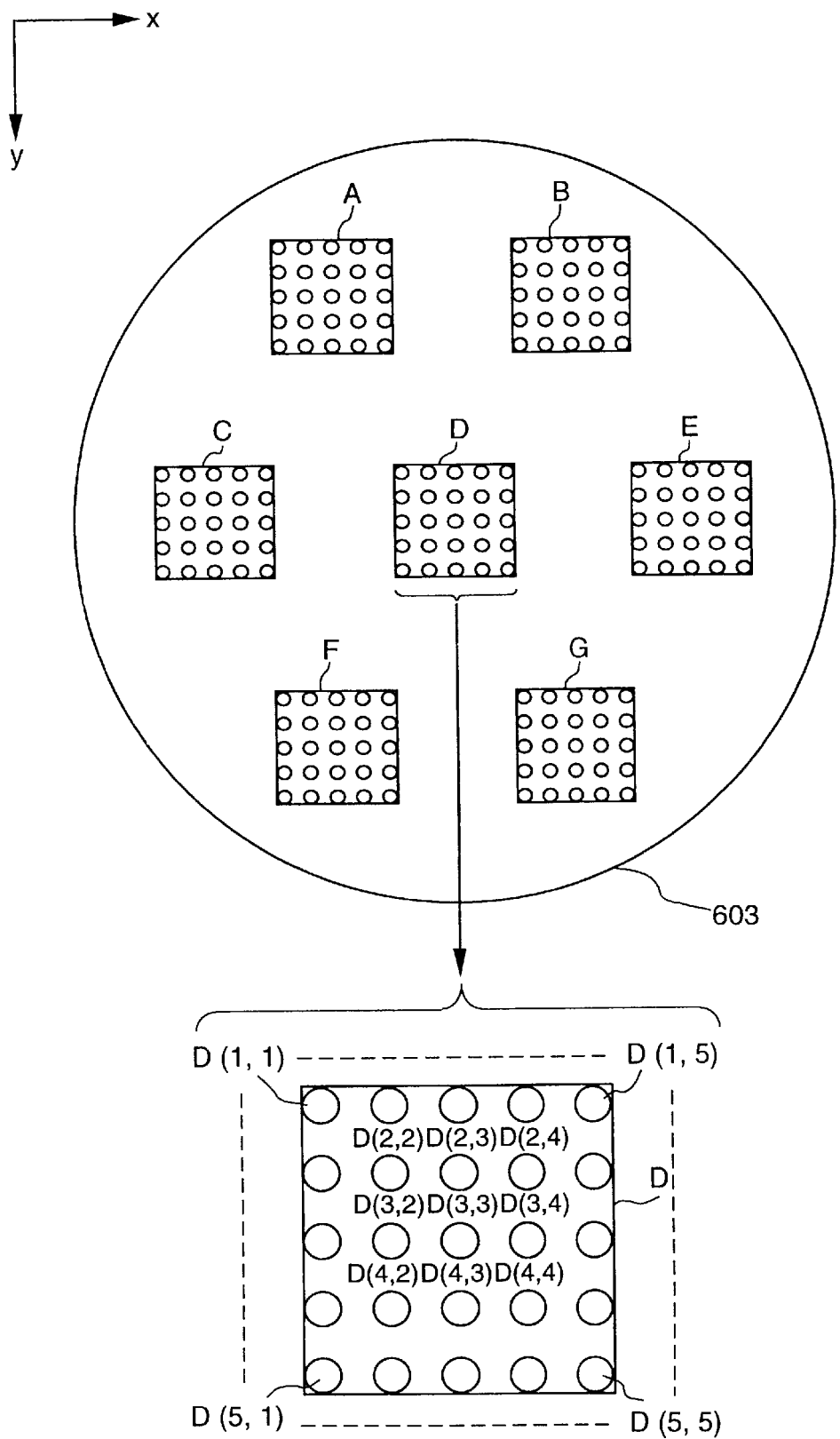
FIG. 2 is a diagram for describing an element electron optical system array.

The element electron optical system array 3 will be explained below with reference to FIG. 2.

The element electron optical system array 3 includes a group (subarray) of a plurality of element electron optical systems, and a plurality of subarrays are formed. In this embodiment, seven subarrays A to G are formed. In each subarray, a plurality of element electron optical systems are two-dimensionally arranged. In each subarray of this embodiment, 25 element electron optical systems like D(1, 1) D(5,5) are formed, and form source images which are arranged at intervals of a pitch pb (mm) on the wafer in both the X- and Y-directions via the reduction electron optical system 4.

Figure 3:
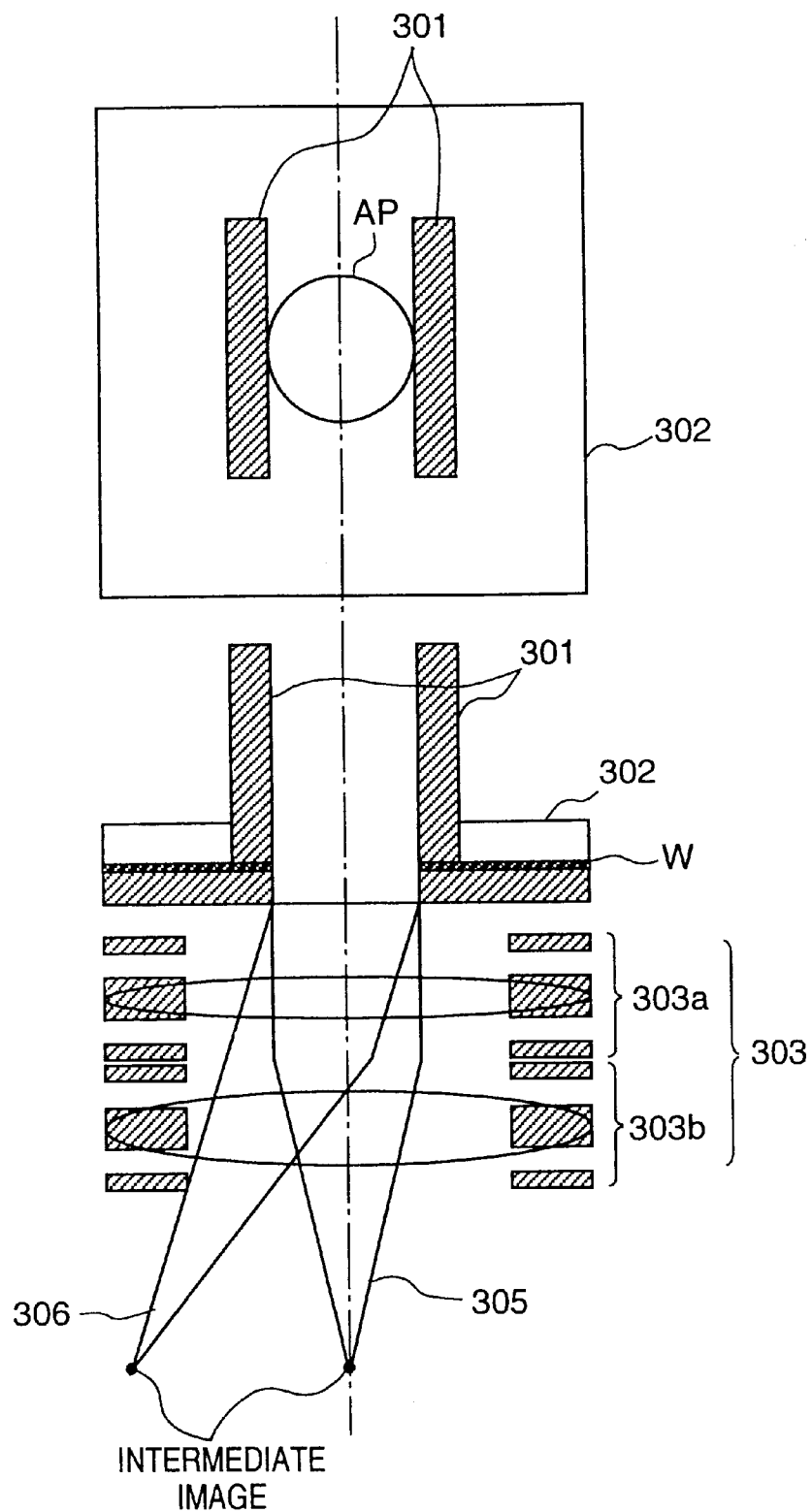
FIG. 3 is a diagram for describing an element electron optical system.

FIG. 3 is a sectional view of each element electron optical system.

Referring to FIG. 3, reference numeral 301 denotes a blanking electrode which is made up of a pair of electrodes and has a deflection function; and 302, a board which has an aperture (AP) for defining the shape of an electron beam that passes therethrough, and is common to other element electron optical systems. On the board 302, the blanking electrode 301 and a wiring (W) for turning on/off the electrode are formed. Reference numeral 303 denotes an electron lens using two unipotential lenses 303a and 303b each of which is built by three aperture electrodes by setting the upper and lower electrodes at an identical acceleration potential V0 and maintaining the middle electrode at another potential V1 or V2, and has a convergence function.

Figure 4A:
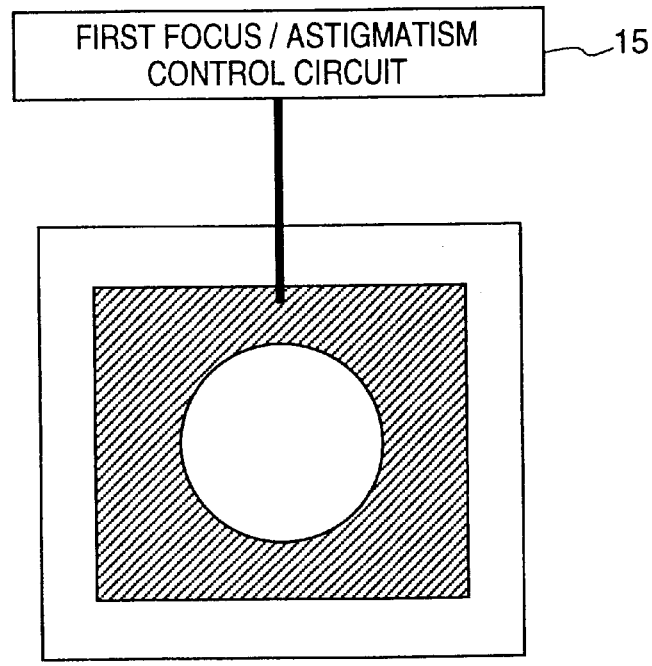
FIGS. 4A and 4B are diagrams for describing electrodes of the element electron optical system.

The upper, middle, and lower electrodes of the unipotential lens 303a, and the upper and lower electrodes of the unipotential lens 303b have a shape, as shown in FIG. 4A, and the upper and lower electrodes of the unipotential lenses 303a and 303b are set at a common potential by a first focal point/astigmatism control circuit 15 (to be described later) in all the element electron optical systems.

Since the potential of the middle electrode of the unipotential lens 303a can be set by the first focal point/astigmatism control circuit 15 in units of element electron optical systems, the focal length of the unipotential lens 303a can be set in units of element electron optical systems.

Figure 4B:
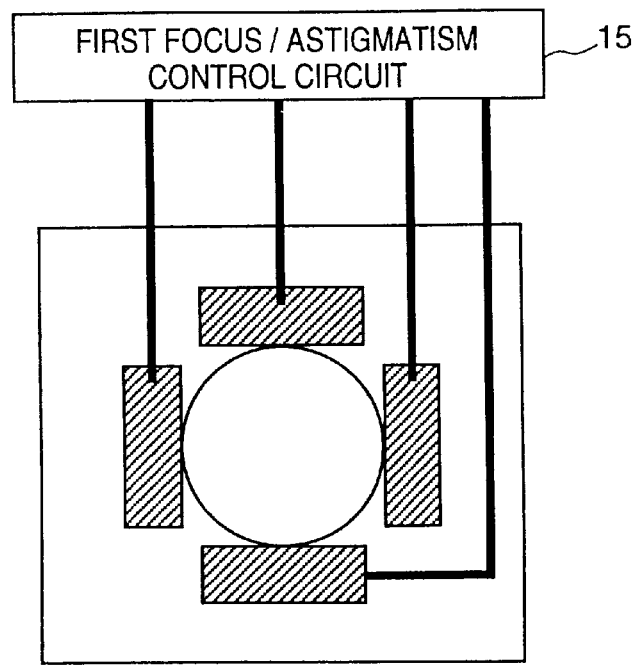

Also, since the middle electrode of the unipotential lens 303b is made up of four electrodes, as shown in FIG. 4B, and their potentials can be independently set by the first focal point/astigmatism control circuit 15 and can also be independently set in units of element electron optical systems, the unipotential lens 303b can have different focal lengths in a section perpendicular thereto and the focal lengths can also be independently set in units of element electron optical systems.

As a consequence, by independently controlling the middle electrodes of the element electron optical systems, the electron optical characteristics (intermediate image formation position, astigmatism) of the element electron optical systems can be controlled.

Electron beams which are converted into nearly collimated beams by the condenser lens 2 form intermediate images of the source by an electron lens 303 via the blanking electrode 301 and the aperture (AP). At this time, when no electric field is applied across the electrodes of the blanking electrode 301, the electron beams are not deflected like electron beams 305. On the other hand, when an electric field is applied across the electrodes of the blanking electrode 301, the electron beams are deflected like electron beams 306. Since the electron beams 305 and 306 have different angular distributions on the object surface of the reduction electron optical system 4, the electron beams 305 and 306 become incident on different regions at the pupil position (on a plane P in FIG. 1) of the reduction electron optical system 4. Hence, a blanking aperture BA that transmits the electron beams 305 alone is arranged at the pupil position (on the plane P in FIG. 1) of the reduction electron optical system.

The individual element electron optical systems respectively set the potentials of their two middle electrodes to correct curvature of field and astigmatism produced when the intermediate images formed thereby are projected onto the surface to be exposed by the reduction electron optical system 4 in a reduced scale, thereby varying their electron optical characteristics (intermediate image formation position and astigmatism). In this embodiment, however, in order to reduce the number of wiring lines between the middle electrodes and the first focal point/astigmatism control circuit 15, the element electron optical systems in a single subarray are set to have identical electron optical characteristics, and the electron optical characteristics (intermediate image formation position, astigmatism) of the element electron optical systems are controlled in units of subarrays.

Furthermore, in order to correct distortion produced when a plurality of intermediate images are projected onto the surface to be exposed by the reduction electron optical system 4 in a reduced scale, the distortion characteristics of the reduction electron optical system 4 are detected in advance, and the positions, in a direction perpendicular to the optical axis of the reduction electron optical system 4, of the individual element electron optical systems are set based on the detected characteristics.

Figure 5:
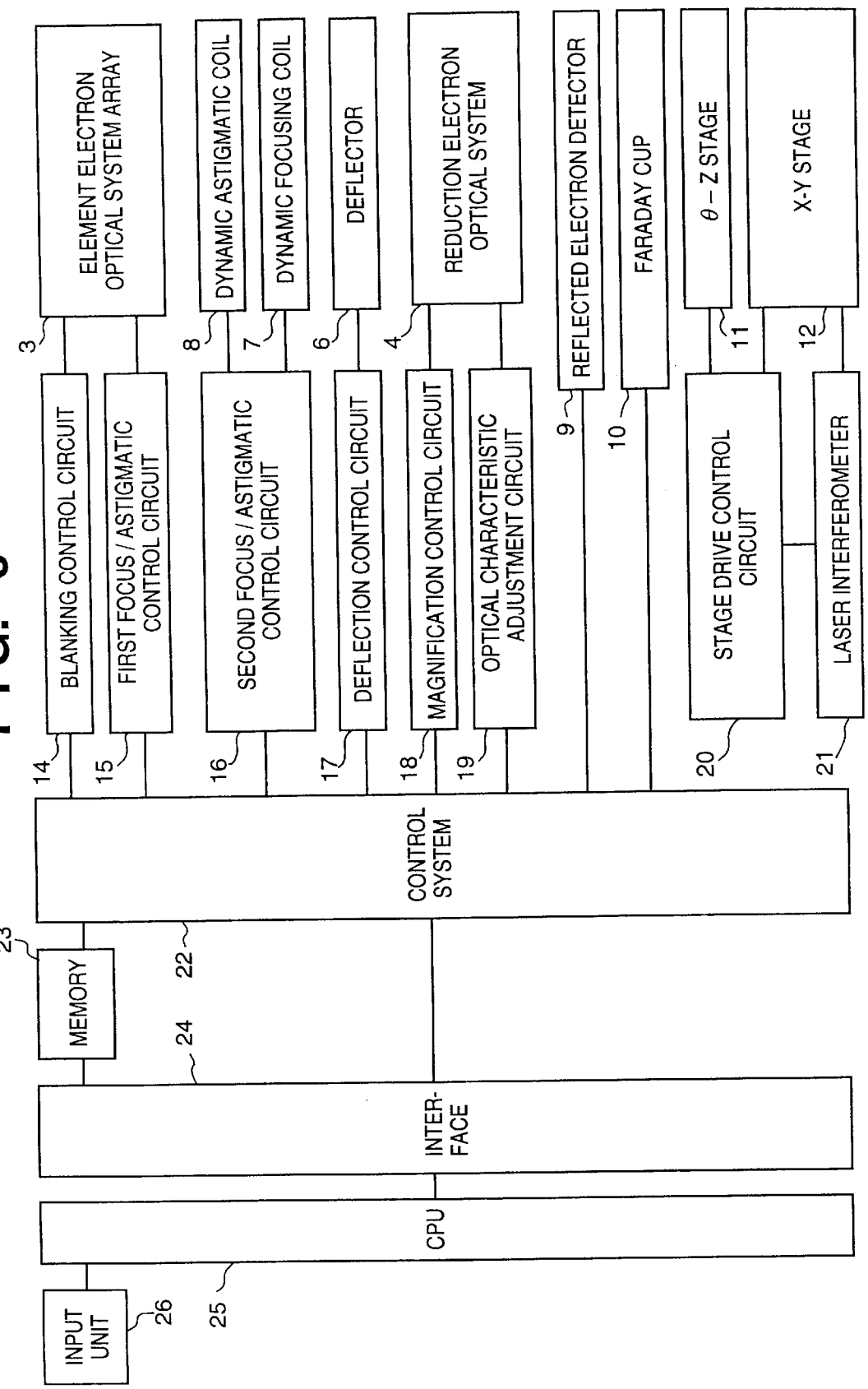
FIG. 5 is a diagram for describing a system configuration according to the present invention.

FIG. 5 shows the system arrangement of this embodiment.

blanking control circuit 14 ON/OFF-controls the blanking electrodes of the individual element electron optical systems of the element electron optical system array 3. The first focal point/astigmatism control circuit 15 controls the electron optical characteristics (intermediate image formation position, astigmatism) of the individual element electron optical systems of the element electron optical system array 3.

A second focus/astigmatism control circuit 16 controls the dynamic astigmatic coil 8 and the dynamic focusing coil 7 to control the focal-point position and the astigmatism of the reduction electron optical system 4. A deflection control circuit 17 controls the deflector 6 (main deflector 61 and auxiliary deflector 62). A magnification adjusting circuit 18 adjusts the magnification of the reduction electron optical System 4. An optical characteristic control circuit 19 changes the excitation current of an electromagnetic lens constituting the reduction electron optical system 4 to adjust rotational aberration or the optical axis.

A stage drive control circuit 20 drives and controls the θ-Z stage 11 as well as the XY stage 12 in cooperation with a laser interferometer 21 which detects the position of the XY stage 12.

An input unit 26 enters pattern data that describes a pattern to be exposed on the wafer 5. The CPU 25 generates exposure control data for controlling each of the abovementioned control circuits, on the basis of the input pattern data, and stores the data in memory 23.

In accordance with an indication from the CPU 25, the control system 22 controls each of the control circuits 14~20, the reflected electron detector 9 and the Faraday cup 10 based upon the exposure control data and other control data stored in the memory 23.

(Description of operation)

Figure 19:
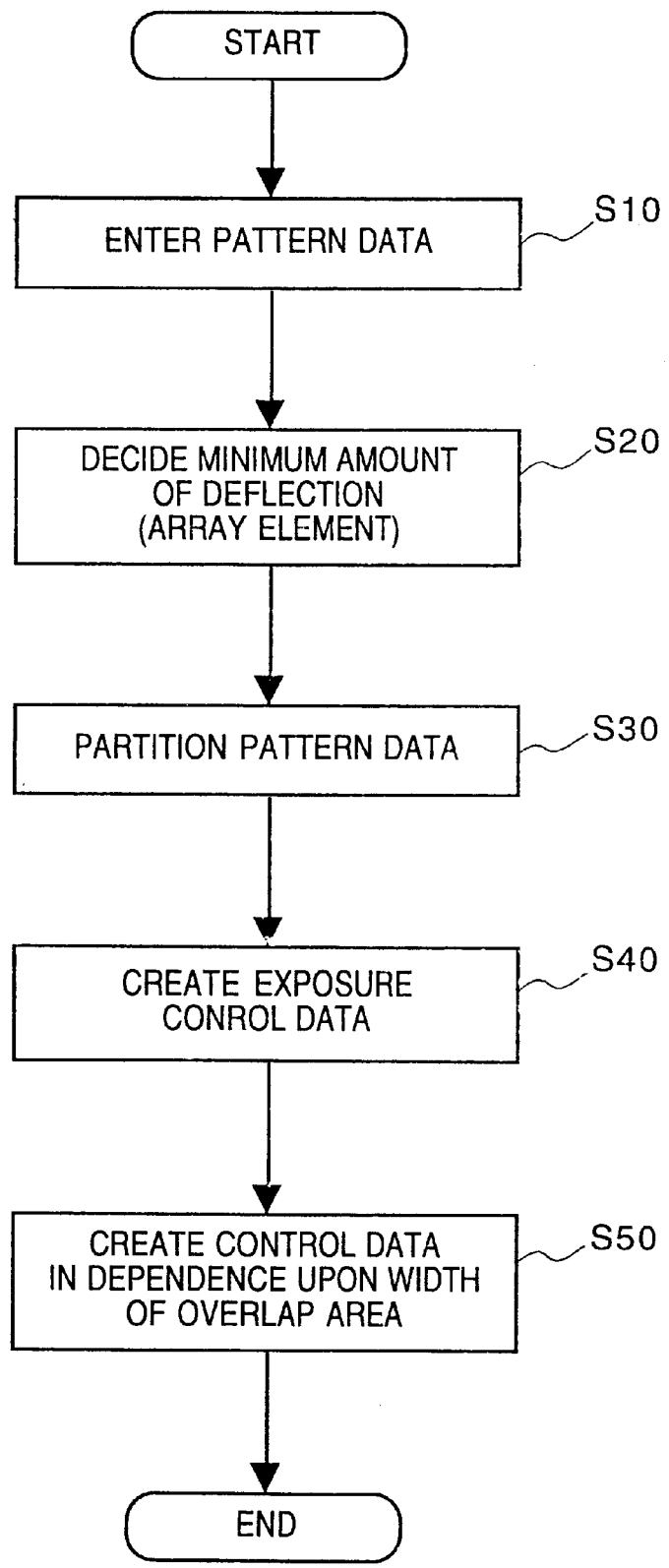
FIG. 19 is a flowchart illustrating the flow of processing through which a CPU creates data, which is used when exposure is performed, based upon input pattern data.

FIG. 19 is a flowchart illustrating the flow of processing through which the CPU 25 creates data, which is used when exposure is performed, based upon input pattern data.

This processing is executed at step S10 in response to entry of pattern data by the input unit 26. This is followed by step S20, at which the CPU 25 acquires, from the pattern data, information relating to the minimum line width of the pattern to be exposed on the wafer, the type of line width and the pattern shape, and decides, based upon this information, the minimum amount of deflection when the electron beam is deflected by the deflector 6. In this embodiment, a common array in which this minimum amount of deflection is adopted as the interval of array elements (FME) is defined with regard to each element electron optical system.

Next, at step S30, the pattern relating to the input pattern data is partitioned in units of exposure areas based upon each of the element electron optical systems (these areas shall be referred to as "element exposure areas"). The pattern is partitioned in such a manner that contiguous element exposure areas will overlap at their edges. This is followed by step S40, at which exposure control data for controlling the exposure operation is generated based upon the pattern data relating to the partitioned pattern. This data is stored in the memory 23.

Control data for controlling the deflector 6 and XY stage 12 is created at step S50 in conformity with the width of the overlap between the partitioned patterns, and the ontrol data is set in the deflection control circuit 17 and stage drive control circuit 20.

The details of processing executed at steps S30 and S40 will now be described.

Figure 6:
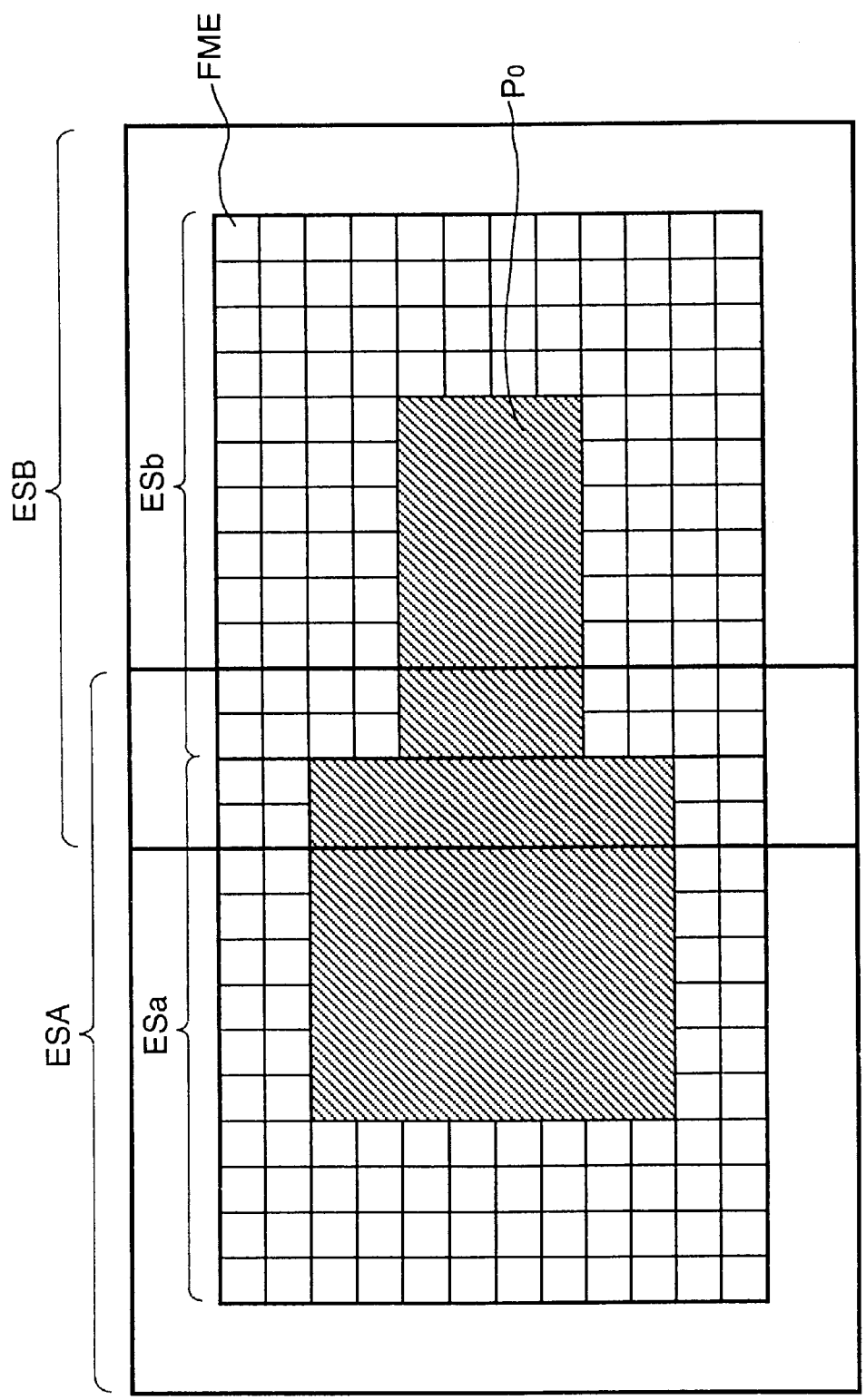
FIG. 6 is a diagram for describing element exposure areas of each element electron optical system.

First, to simplify the description, a pattern capable of being exposed is hypothesized by two element electron optical systems and the two element electron optical systems shall be represented by a and b. FIG. 6 illustrates one continuous pattern P0 as an example of a pattern to be exposed on the wafer 5.

In the prior art, the pattern P0 is partitioned in such a manner that element exposure areas ESa, ESb corresponding to the element electron optical systems a, b, respectively, will contact at their respective boundaries. For each element electron optical system, the pattern data relating to this pattern is converted to exposure control data that is in accordance with a common array constituted by array elements FME. The exposure control data for such control is such that, with regard to array elements FME of the portion (the hatched area) in which the pattern resides on the array corresponding to the element exposure area, the blanking electrode of the element electron optical system corresponding to this element exposure area is turned off to irradiate the wafer with the electron beam, and such that with regard to array elements FME of the portion in which the pattern does not reside, the blanking electrode is turned on to interrupt the electron beam.

By contrast, in this embodiment, element exposure areas are set in such a manner that contiguous element exposure areas overlap at their peripheral portions, as illustrated in FIG. 6. ESA, ESB represent element exposure areas, which correspond respectively to the element electron optical systems a, b, defined in the electron beam exposure apparatus according to this embodiment. More specifically, in this embodiment, the deflector 6 is controlled in such a manner that the element exposure areas ESA, ESB, which are larger than the element exposure areas ESa, ESb of the prior art, can be exposed. Here the width of the overlap is set based upon the precision of the positional setting (the deflection accuracy) of the deflector 6.

Figure 7A:
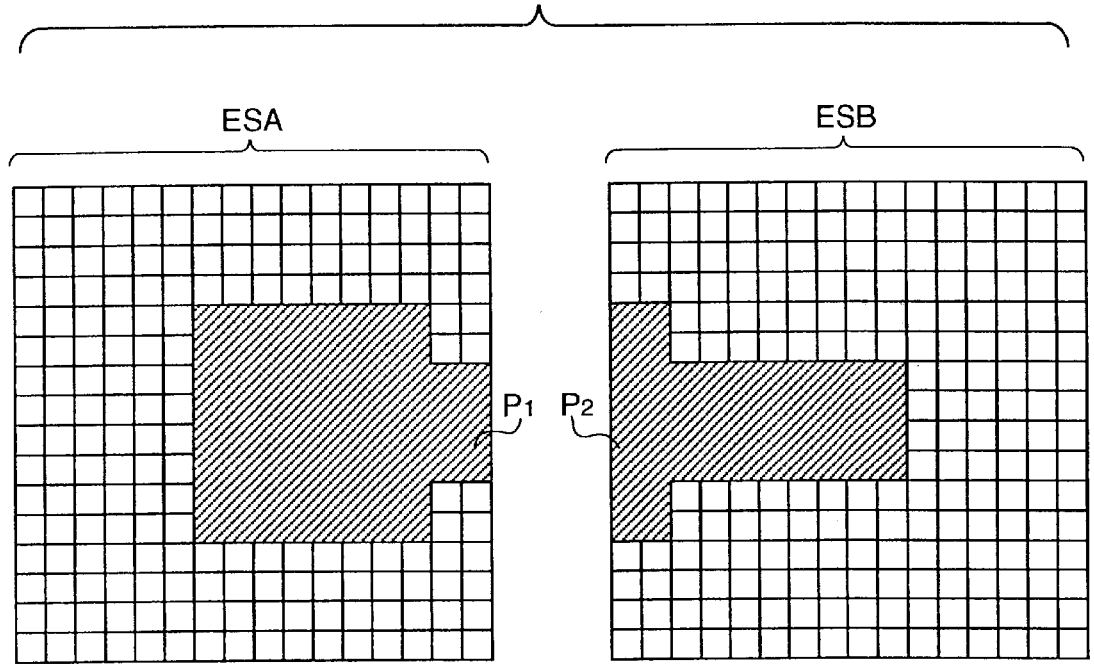
FIGS. 7A and 7B are diagrams for describing a pattern exposed on the element exposure area of each element electron optical system.

When the pattern data relating to the pattern P0 shown in FIG. 6 is entered, the CPU 25 partitions the pattern P0 (step S30) so as to correspond to the overlapping element exposure areas ESA, ESB after deciding the minimum amount of deflection (array element FME) at step S20. FIG. 7A is a diagram illustrating the patterns in the element exposure areas ESA and ESB. The pattern P0 in FIG. 7A is partitioned into overlapping patterns P1 and P2.

The drawing of the pattern in each element exposure area is carried out by using the auxiliary deflector 62 of the deflector 6 to deflect the electron beam, which irradiates the wafer, from the element electron optical system. Drawing the pattern corresponding to each element exposure area while the electron beam is deflected by the auxiliary deflector 62 completes the drawing of a pattern in a subfield (SF), which is constituted by a plurality of element exposure areas corresponding to the plurality of element electron optical systems [e.g. D(1,1)~D(5,5)] (see FIGS. 12, 13). Next, by changing the setting of the main deflector 61 of deflector 6, the drawing of the pattern for the next subfield (SF) is made possible and the pattern is drawn in this subfield (SF) while the electron beam is deflected by the auxiliary deflector 62. The exposure areas over the entire surface of the wafer can be exposed by repeating this operation (see FIG. 14).

To simplify the description, portions at which subfields (SF) are mutually adjacent, namely element exposure areas at the outer peripheral portion of the subfields (SF), are defined as external element exposure areas, and element exposure areas other than the external element exposure areas are defined as internal element exposure areas.

In this embodiment, the width of overlap is set to be larger at a portion where external element exposure areas belonging to mutually different subfields (SF) are contiguous than at a portion where internal element exposure areas or an internal element exposure area and an external element exposure area are contiguous. The reason for this is that whereas the element exposure areas in each subfield (SF) are exposed simultaneously (i.e., while the electron beam is scanned by the auxiliary deflector 62), exposure is performed at different times with regard to contiguous subfields (SF). In other words, after a subfield (SF) is exposed, a suitable period of time elapses by the time the contiguous subfield (SF) is exposed. This provides a solution to the problem of the prior art, namely the fact that a change in the deflector 6 with time is not negligible and makes it difficult to assure the continuity of the pattern between external element exposure areas.

The pattern is partitioned at step S30 upon deciding the width of the overlap so as to satisfy the above-mentioned conditions based upon the minimum amount of deflection (array element FME), and the control data for controlling the deflector 6 and XY stage 12 is generated in dependence upon the width of the overlap.

Figure 7B:
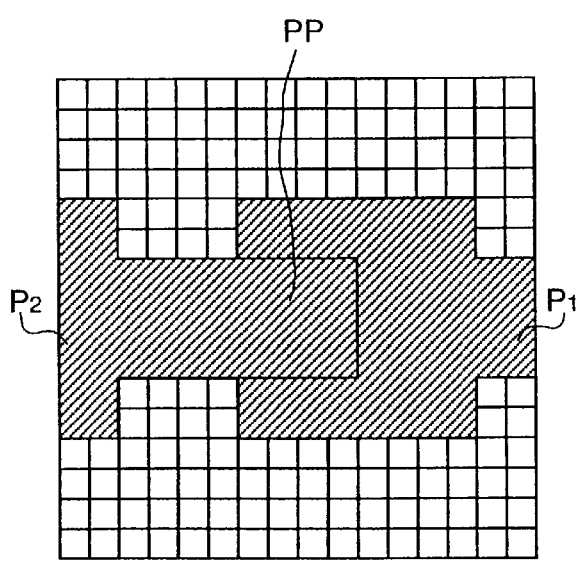

As shown in FIG. 7B, a setting area PP (the hatched area) comprising array elements which describe the pattern is decided by at least one of the element electron optical systems a, b at step S40. In general, it will suffice to calculate the logical OR of the array elements relating to all of the element electron optical systems.

The entire area within a pattern to be exposed on the wafer can be exposed by exposing the wafer upon setting the electron beam irradiation positions when the irradiation positions of the plurality of electron beams emitted by the plurality of element electron optical systems of the element electron optical system array 3 are situated on the array elements in the setting area PP. On the other hand, when the plurality of electron beams are situated in the areas other than the setting area PP (areas in which the wafer is not irradiated by any of the plurality of electron beams), the electron beams are deflected without setting the electron beam irradiation positions, thereby making it possible to eliminate unnecessary settings and to finish exposure at high speed.

Accordingly, the positions of the array elements in which the electron beams are to be set, namely the positions of the array elements belonging to the setting area PP, are decided based upon data relating to the setting area PP shown in FIG. 7B, and deflection control data which specifies that the positions of the electron beams are to be set solely at these positions is generated.

In order to draw the pattern on the wafer, it is required that the blanking electrode of each element electron optical system be controlled to control the emission/interruption of the electron beams at the positions at which the plurality of electron beams are set. The patterns of FIG. 7A indicate areas (not hatched) to be irradiated with the electron beam from each of the element electron optical systems a, b, and areas (hatched) in which the electron beam is interrupted. Accordingly, on the basis of the data relating to the patterns shown in FIG. 7A, blanking control data for controlling the on/off operation of the blanking electrode in conformity with the positions of the array elements is created with regard to each element electron optical system.

Figure 8:
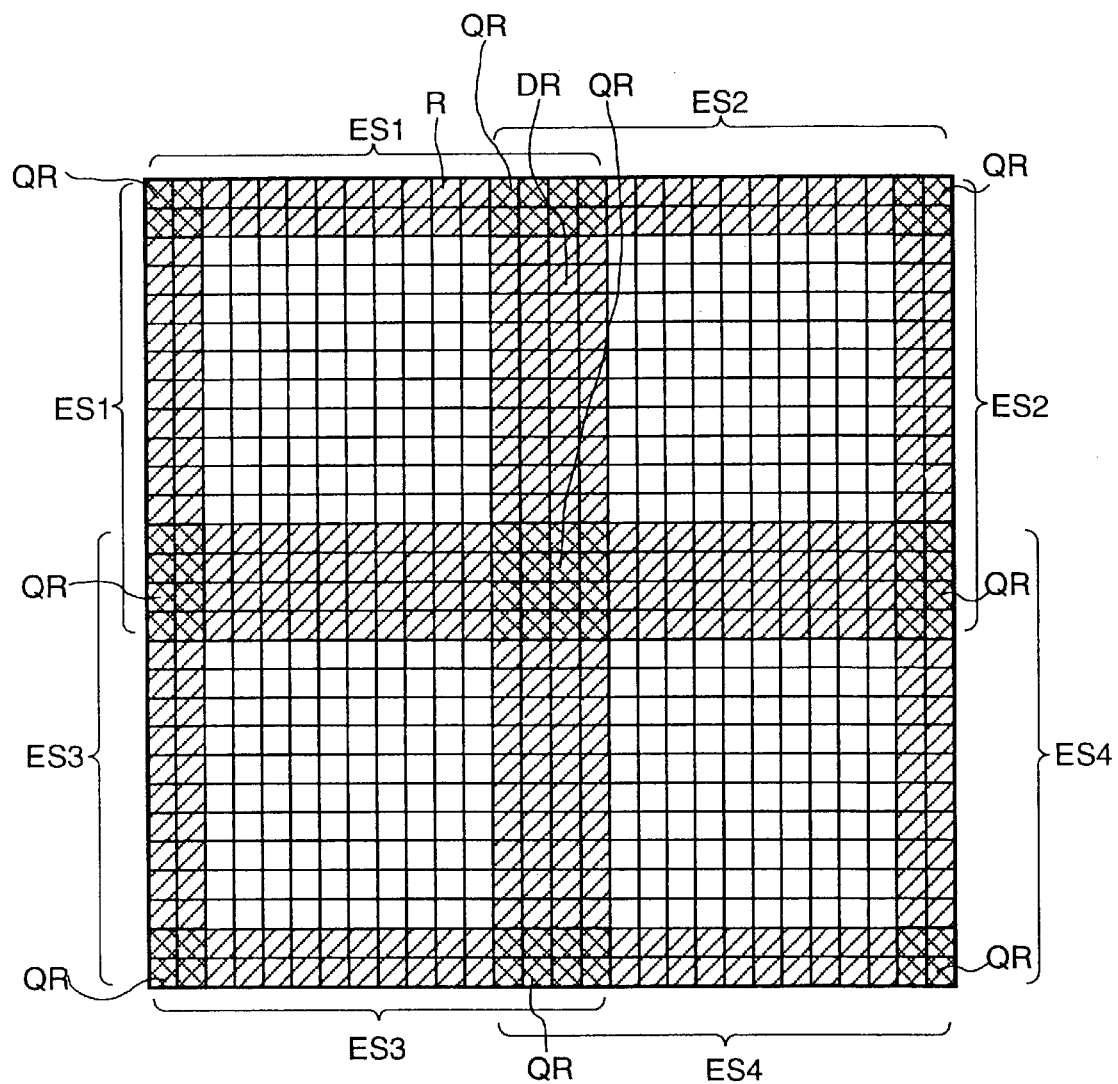
FIG. 8 is a diagram for describing overlapping of element exposure areas.

If the amounts of exposure at positions to be exposed are made uniform at this time, i.e., if the irradiation times of the electron beams in the periods of time in which the positions of the electron beams have been set are fixed, the total amount of irradiation at the overlapping portions of the exposure areas will be double that at the other portions. Accordingly, it is necessary to perform control for every element electron optical system so as to reduce the amount of electron beam irradiation at the portions where the exposure areas overlap. The specific method will be described with reference to FIG. 8.

Two element exposure areas have been dealt with heretofore in order to simplify the description. However, since the element exposure areas of a plurality of element electron optical systems are arrayed in two dimensions in this electron beam exposure apparatus, four element exposure areas ES1, ES2, ES3, ES are arrayed in two dimensions in FIG. 8 in order to render a description closer to actuality. It goes without saying that the exposure areas are set to overlap at portions where the element exposure areas are contiguous even in this example. Accordingly, the element exposure area ES1 can be classified into an area R in which exposure areas do not overlap, an area DR in which two exposure areas overlap, and an area QR in which four exposure areas overlap. In the element electron optical system which exposes the element exposure area ES1, therefore, control is performed in such a manner that the amount of electron beam irradiation is changed depending upon the particular area in which the array position to be exposed is situated. More specifically, if we let an overlap degree N represent N overlaps (where N is an integer), then control is carried out so as to perform irradiation of a reference amount in the area R in which the overlap degree is 2, of 0.5 of the reference amount of irradiation in area DR and of 0.25 of the reference amount of irradiation in area QR in which the overlap degree is 4. In other words, control is performed so as irradiate the wafer with the electron beam from the element electron optical system with an amount of irradiation that conforms to the overlap degree of the exposure areas or that is inversely proportional to the overlap degree of the exposure areas.

Figure 9:
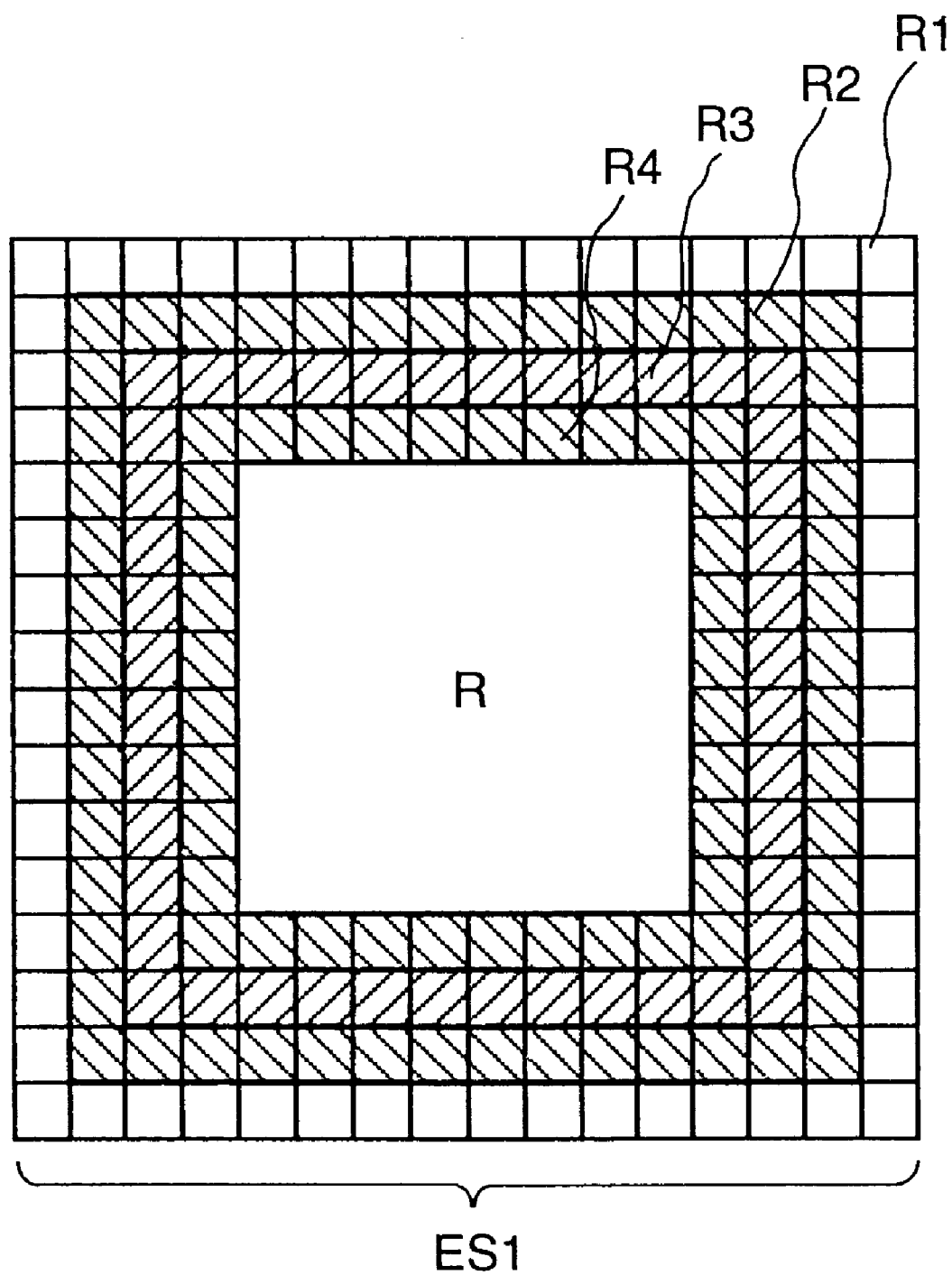
FIG. 9 is a diagram for describing classifications in an element exposure area.

Further, as illustrated in FIG. 9, an overlapping portion may be classified into areas R1, R2, R3, R4 that conform to the distance from the boundary of the exposure area, and control may be carried out so as to perform irradiation of a reference amount in the area R, of 0.8 of the reference amount of irradiation in area R4, of 0.6 of the reference amount of irradiation in area R3, of 0.4 of the reference amount of irradiation in area R2, and of 0.2 of the reference amount of irradiation in area R1. In other words, control is performed so as to irradiate the wafer with the electron beam from the element electron optical system with an amount of irradiation that conforms to the distance from the boundary of the exposure area or that is proportional to the distance from the boundary of the exposure area. It is of course permissible to set the amount of irradiation by performing multiplication using a coefficient conforming to the above-mentioned overlap degree.

Figure 10:
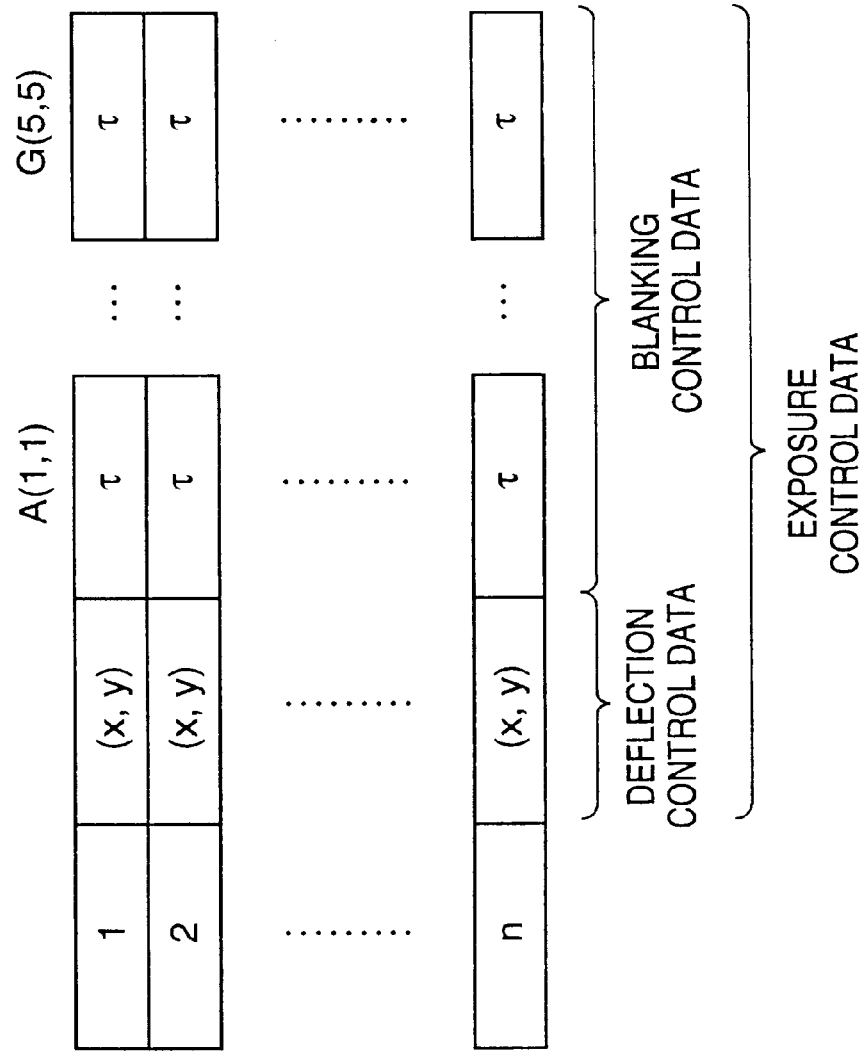
FIG. 10 is a diagram for describing exposure control data.

Using the above-mentioned deflection control data as well as the blanking data for each element electron optical system, the CPU 25 creates exposure control data, of the kind shown in FIG. 10, in which the elements are the array position exposed by at least one electron beam and the operating time (which decides the amount of electron beam irradiation) of the blanking electrode of each element electron optical system at this array position. In this embodiment, this processing is executed by the CPU 25 of the electron beam exposure apparatus. However, there is no difference in objects and effects even if this processing is executed by another processing device and the exposure control data is entered from the input unit 26.

Next, when the CPU instructs the control system 22 via the interface 24 to execute exposure, the control system 22 executes the following steps based upon the exposure control data that has been stored in the memory 23:

(Step 1)

The control system 22 sends the exposure control data to each of the control circuits successively in sync with the internal reference clock. That is, in sync with the internal reference clock, the control system 22 instructs the deflection control circuit 17 to deflect, by means of the auxiliary deflector 62 of deflector 6, the plurality of electron beams from the element electron optical system array in two dimensions within the element exposure area that corresponds to each electron beam, and instructs the blanking control circuit 14 to turn the blanking electrode of each element electron optical system on and off in dependence upon the pattern to be exposed on the wafer 5 and to control the operating time of the blanking electrode. At this time, the XY stage 12 is moved continuously in the X or Y direction and the deflection control circuit 17 controls the deflection positions of the electron beams upon taking the amount of movement of the XY stage 12 into consideration.

Figure 11:
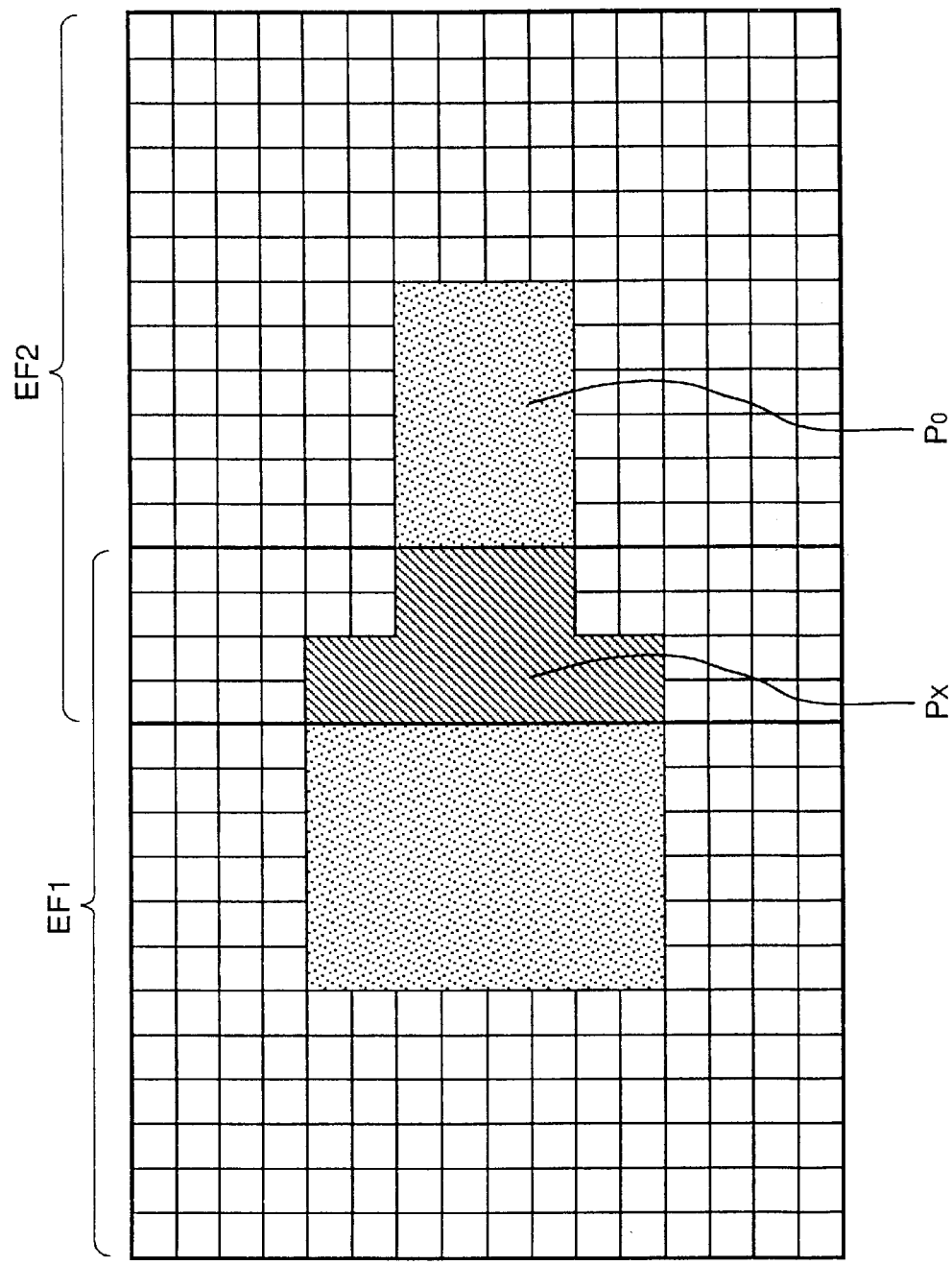
FIG. 11 is a diagram for describing the element exposure area and exposure pattern of each element electron optical system on a wafer.

As a result, exposure is executed upon arranging it so that overlap is brought about at the portions where the rectangular element exposure areas (EF1, EF2) are contiguous, as illustrated in FIG. 11, where the two element electron optical systems of interest are the systems a and b mentioned above, by way of example. Further, in all element exposure areas where exposure is executed one time, the emission/interruption of the respective electron beams is controlled individually while the settings of the irradiation positions of the respective electron beams are controlled simultaneously. At array elements where the wafer is irradiated by the electron beams, the irradiation times are controlled individually in relation to the respective electron beams.

Even if the relative positional relationship between two element exposure areas a, b shifts somewhat owing to a manufacturing problem or the like, the shape of the pattern P0 spanning the two element exposure areas a, b merely undergoes deformation and the pattern P0 is exposed on the wafer as a continuous pattern (i.e., a pattern devoid of interruptions or the like). The reason for this is that the pattern Px of the overlap is exposed in redundant fashion by the two element electron optical systems.

Figure 12:
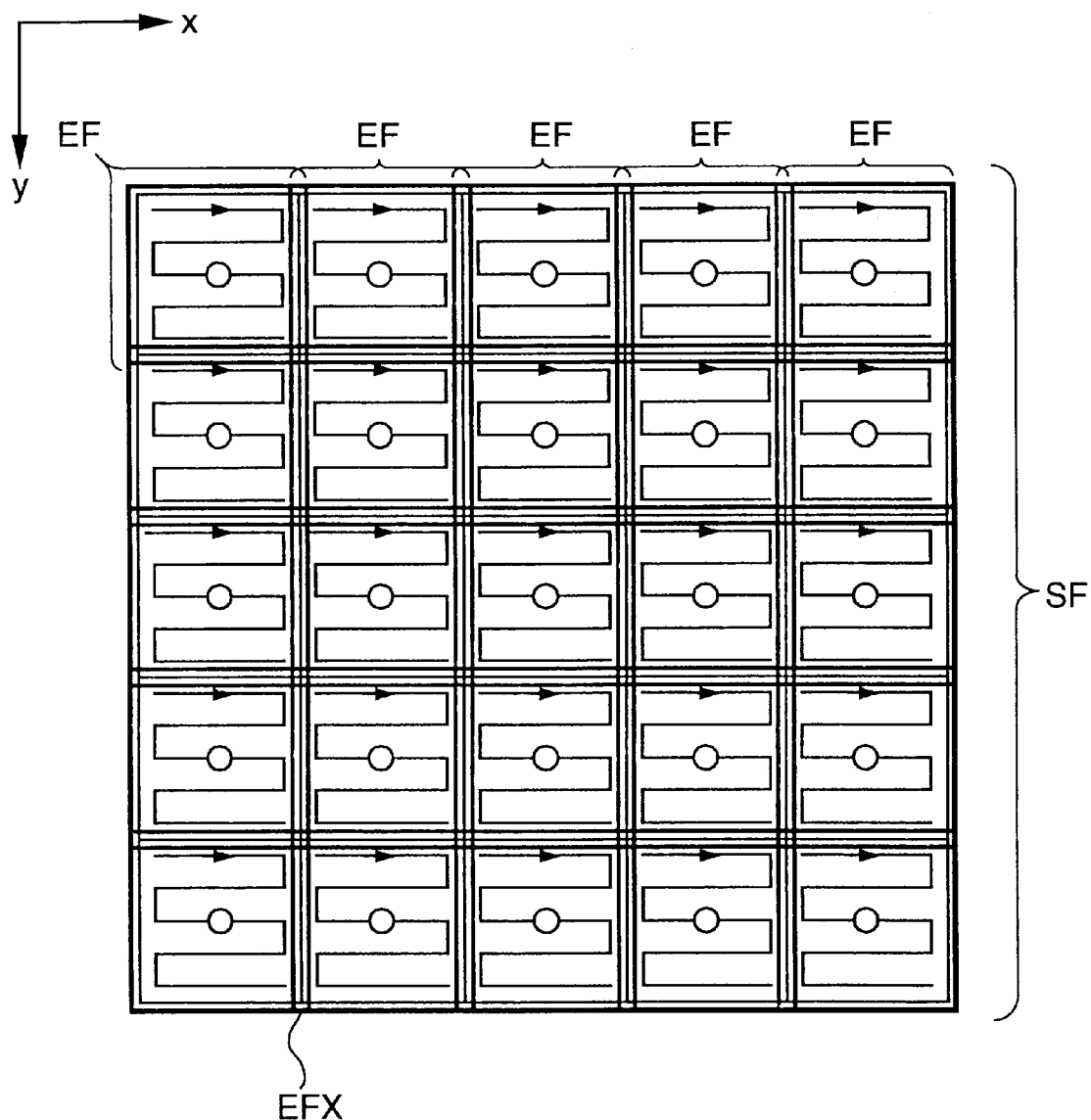
FIG. 12 is a diagram for describing a subfield (SF)
Figure 13:
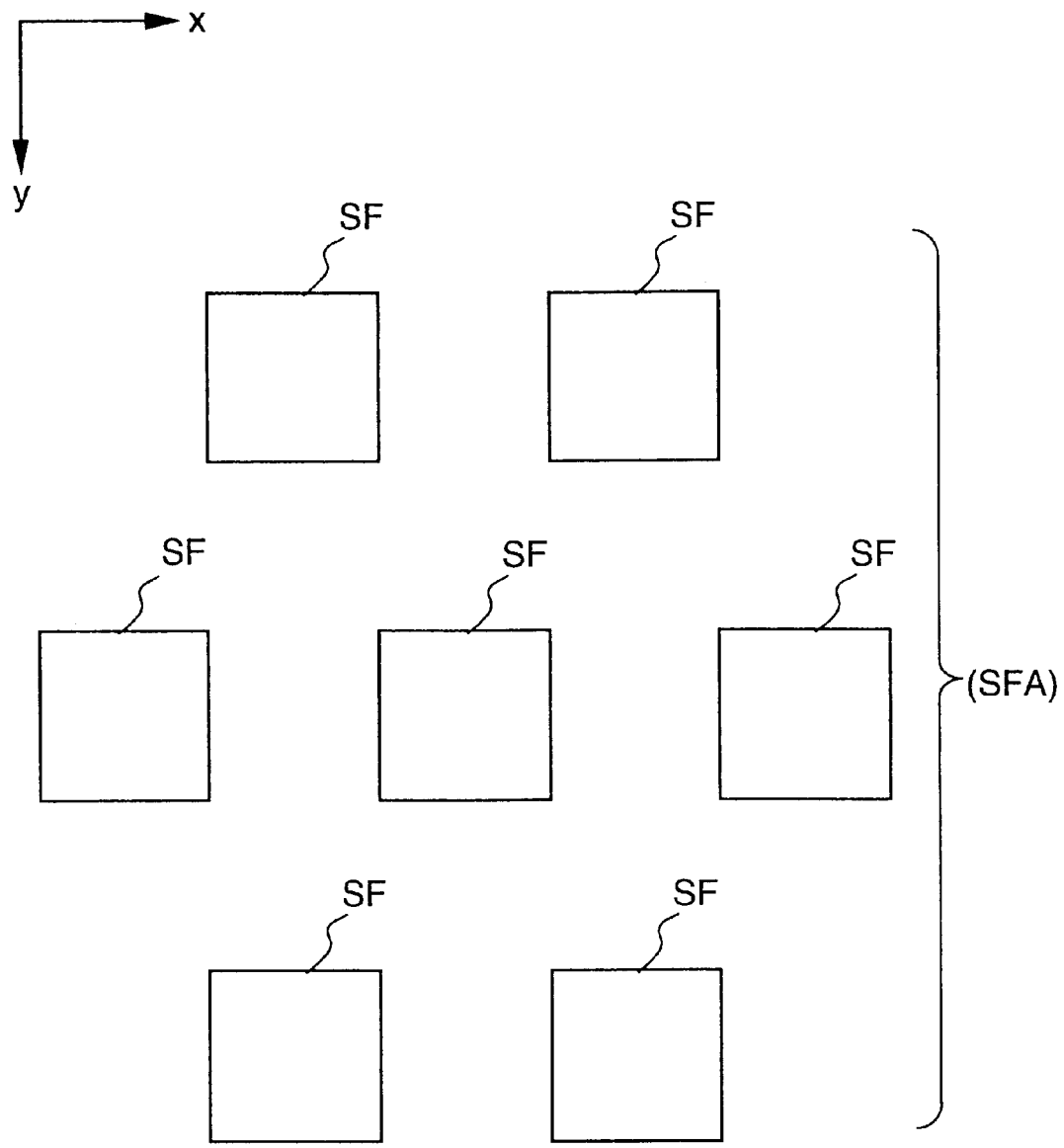
FIG. 13 is a diagram for describing a subfield group (SFA)

Next, with regard to the subarray, it is so arranged that an overlap (EFX) is brought about at the portions where the rectangular element exposure areas (EF) are contiguous, as shown in FIG. 12, and a subfield (SF) obtained by joining a plurality of the element exposure areas (EF) is exposed. In this embodiment, subarrays A~G are provided, as shown in FIG. 2. Consequently, a subfield group (SFA) constituted by a plurality of the subfields (SF) corresponding to the subarrays A~G are exposed, as shown in FIG. 13, by a single exposure operation of the subarray exposure field (SF). It should be noted that the electron beams are scanned by the auxiliary deflector 62 in each element exposure area (EF) in the directions of the arrows, by way of example.

(Step 2)

Figure 14:
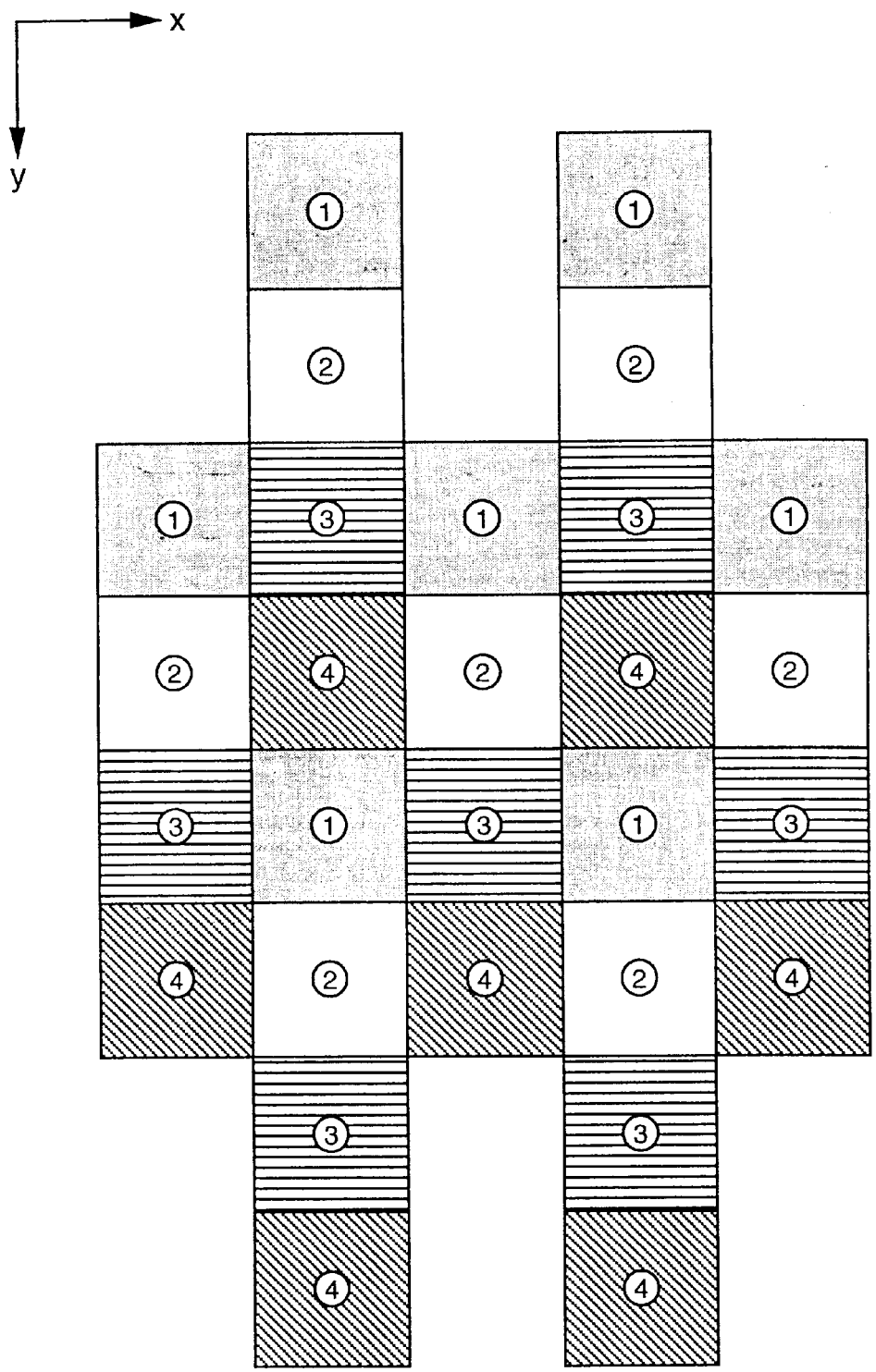
FIG. 14 is a diagram for describing full-surface exposure of a wafer.

After the subfield ① shown in FIG. 14 is exposed, the control system 22 instructs the deflection control circuit 17 to control the deflection of the electron beams from the element electron optical system array by the main deflector 61 of the deflector 6 in such a manner that the subfield ② can be exposed.

Deflection of the electron beams by the deflector 6 is controlled in such a manner that portions of the external element exposure areas will overlap at the portion where subfields ① and ②, for example) are contiguous, as set forth above. The width of this overlap is controlled in such a manner that the width at the portion where the external element exposure areas belonging to different subfields are contiguous is larger than the width at the portion where the element exposure areas are contiguous in the same subfield.

Figure 15A:
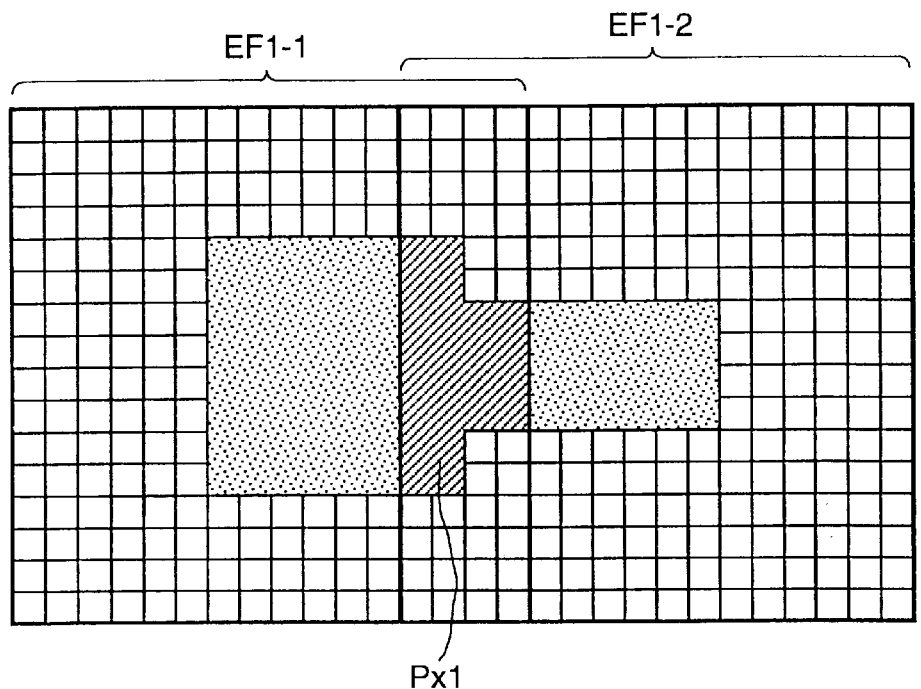
FIGS. 15A and 15B are diagrams for describing the difference between the width of overlap of contiguous element exposure areas in a subfield and the width of overlap of element exposure areas of contiguous, mutually different subfields.
Figure 15B:
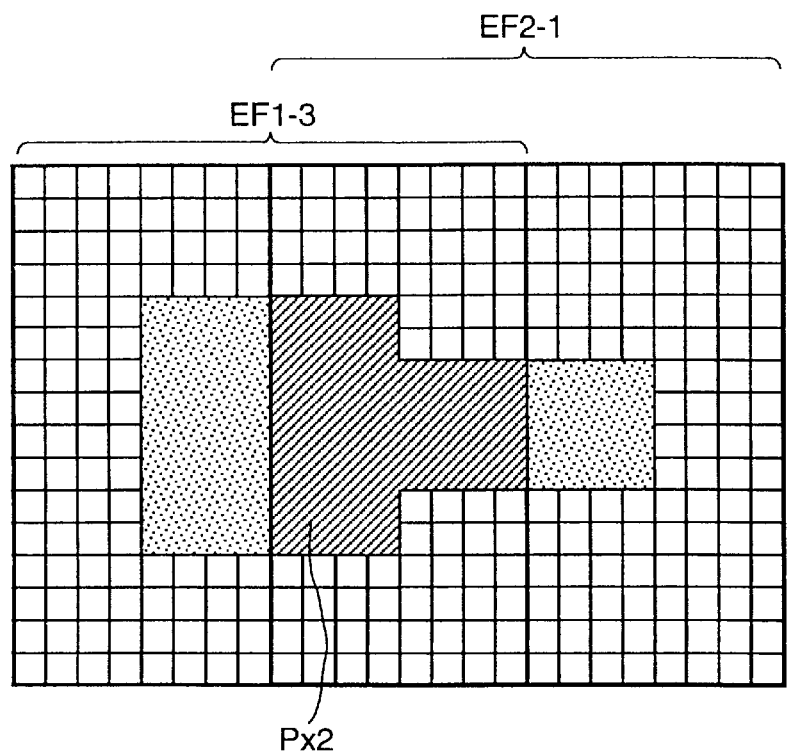

A specific example is shown in FIGS. 15A and 15B. FIG. 15A illustrates an example of an overlapping area Px1 (the hatched area) between element exposure areas EF1-1 and EF1-2 in subfield ①, and FIG. 15B illustrates an example of an overlapping area Px2 (the hatched area) between an external element exposure area EF1-3 of subfield ① and an external element exposure area EF2-1 of subfield ②. In the illustrated example, the width of the overlapping area Px2 of the external element exposure areas belonging to mutually different subfields is set to be twice the width of the overlapping area Px1 of the element exposure areas in the same subfield.

The control system 22 instructs the second focus/ astigmatism control circuit 16 to control the dynamic focus coil 7 based upon predetermined dynamic focus correction data, thereby correcting the focal-point position of the reduction electron optical system 4, and to control the dynamic astigmatic coil 8 based upon dynamic astigmatism correction data obtained in advance, thereby correcting the astigmatism of the reduction electron optical system. The operation of step 1 is then performed again to expose the subfield ②.

The steps 1 and 2 are repeated to sequentially expose subfields in the order of 3, 4, . . . , as shown in FIG. 14, thereby exposing the entire surface of the wafer.

An embodiment of a method of producing a device utilizing the electron beam exposure apparatus and exposure method set forth above will be described next.

Figure 16:
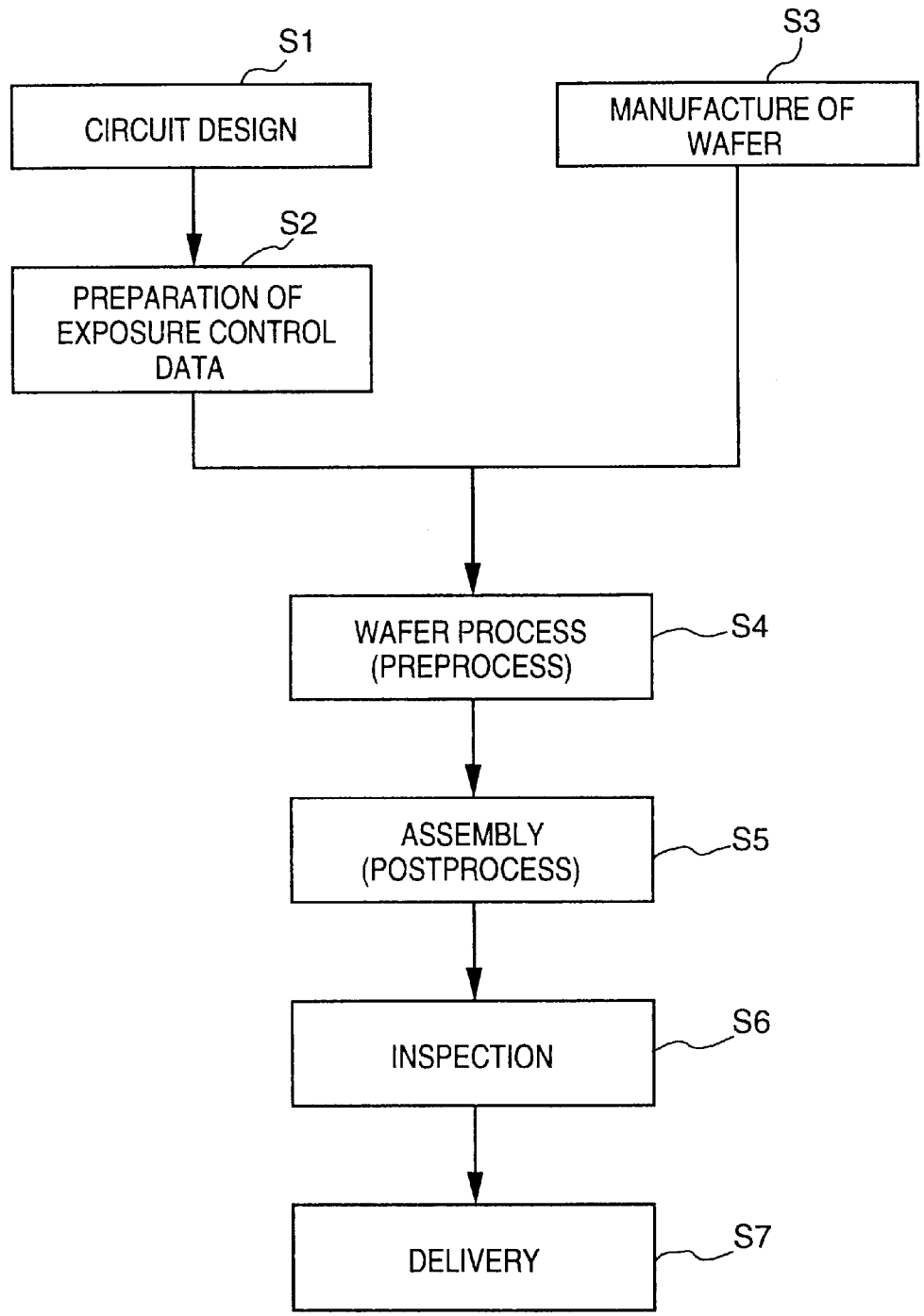
FIG. 16 is a flowchart for describing the manufacture of a microdevice.

FIG. 16 is a flowchart illustrating the manufacture of a microdevice (a semiconductor chip such as an IC or LSI chip, a liquid crystal panel, a CCD, a thin-film magnetic head, a micromachine, etc.). The circuit of the semiconductor device is designed at step 1 (circuit design). Exposure control data (or pattern data) for the exposure apparatus is created based upon the design circuit pattern at step 2 (preparation of exposure control data). A wafer is manufactured using a material such as silicon at step 3 (manufacture of wafer). At step 4 (wafer process), which is referred to as a preprocess, an actual circuit is formed on the wafer by lithography using the wafer and the exposure apparatus in which the prepared exposure control data (or pattern data) has been entered. At step 5 (assembly), which is referred to as a postprocess, semiconductor chips are formed from the wafer fabricated at step 4. This postprocess includes an assembly process (dicing and bonding) and a packaging process (chip encapsulation). The semiconductor device fabricated at step 5 is subjected to inspections such as a test for confirmation of operation and a test of durability at step 6 (inspection). These steps are executed to complete the manufacture of the semiconductor device, which is delivered at step 7.

Figure 17:
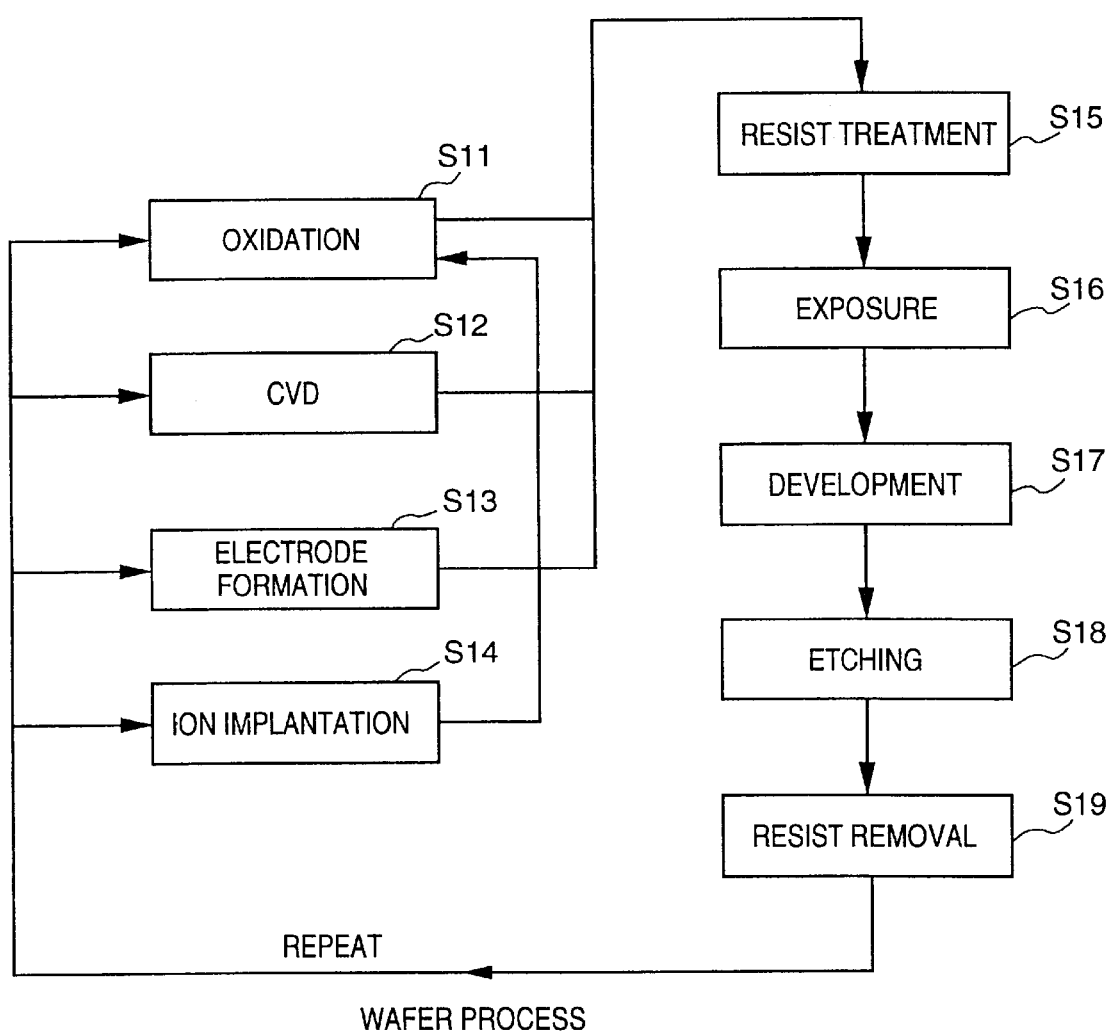
FIG. 17 is a flowchart for describing a wafer process.
Figure 18A:
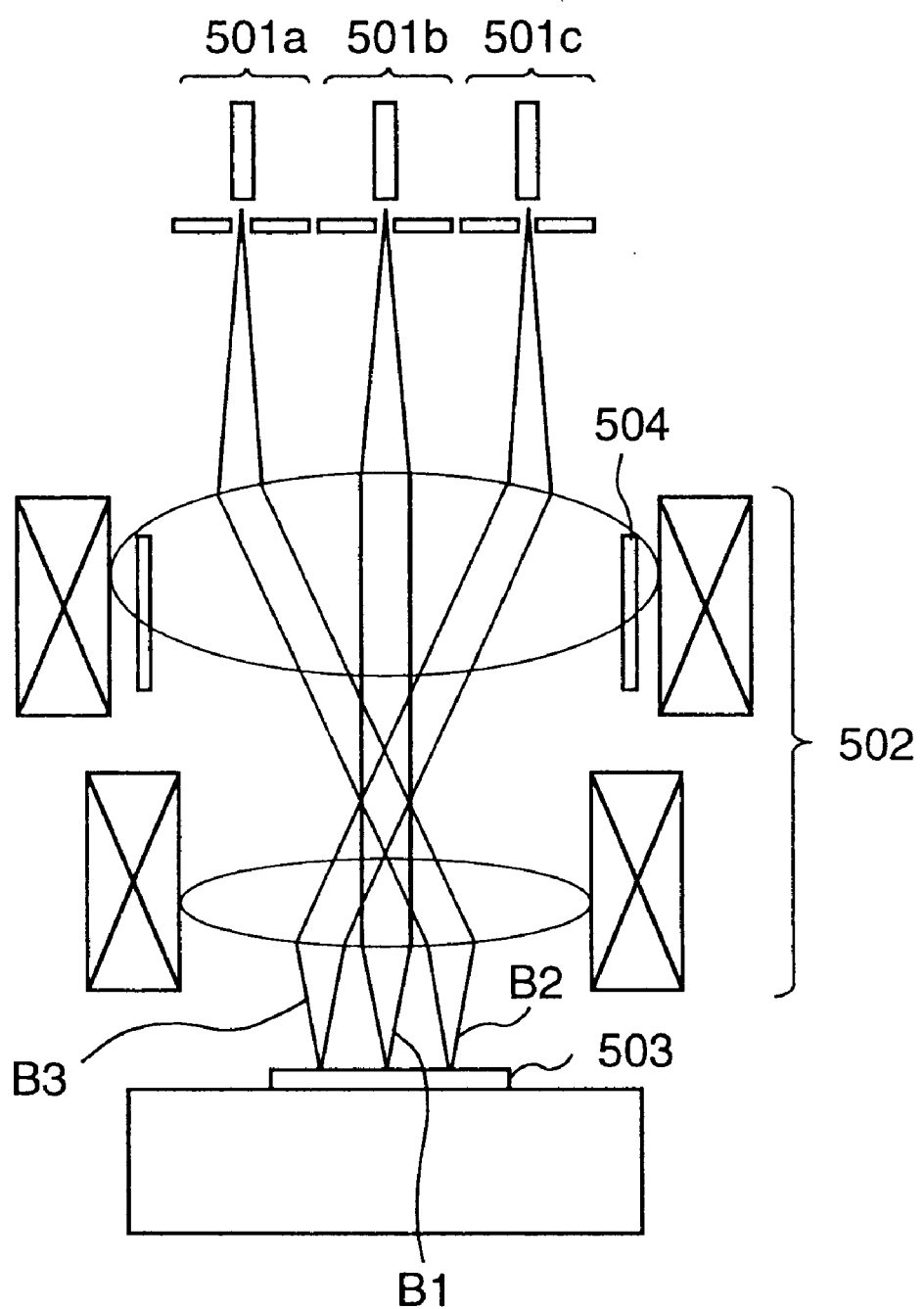
FIGS. 18A to 18C are diagrams for describing a multi-beam electron beam exposure apparatus according to the prior art.
Figure 18B:
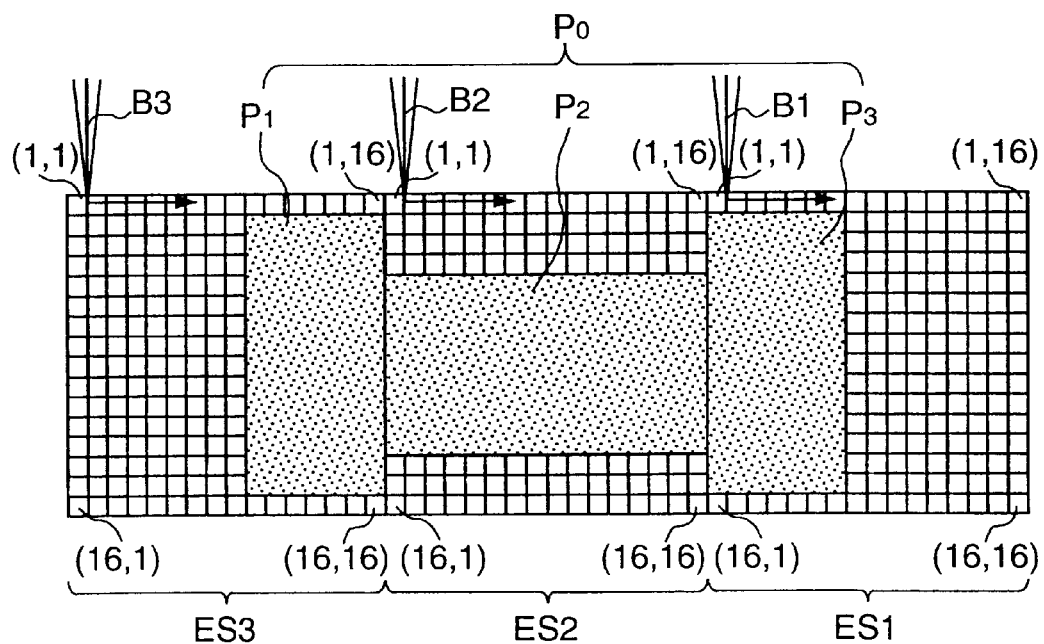
Figure 18C:
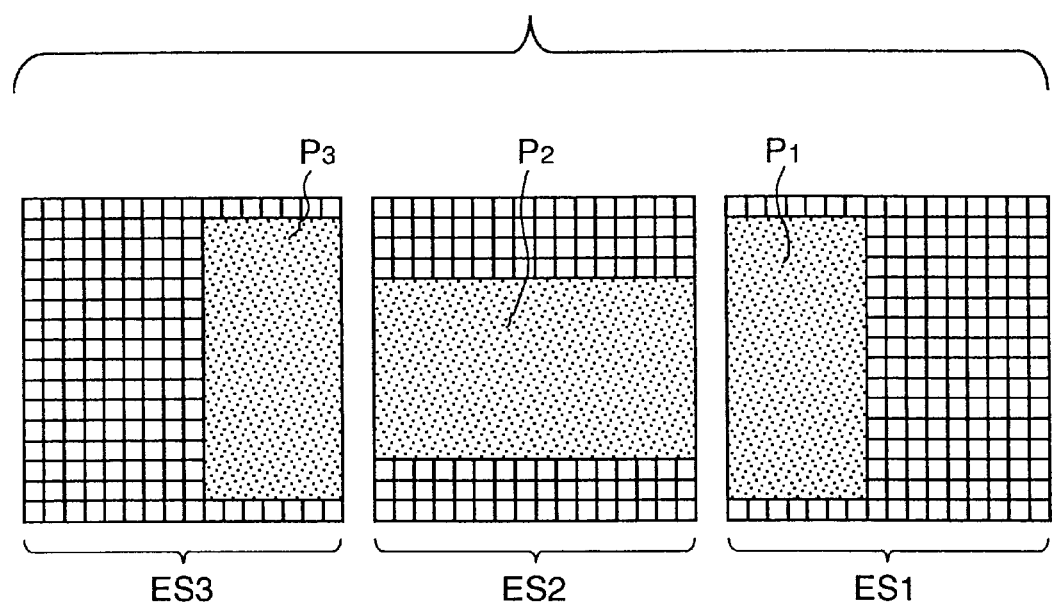

FIG. 17 is a flowchart showing the wafer process in detail. The surface of the wafer is oxidized at step 11 (oxidation) and an insulating film is formed on the wafer surface at step 12 (CVD). An electrode is formed on the wafer by vapor deposition at step 13 (electrode formation), and ions are implanted in the wafer at step 14 (ion implantation). The wafer is coated with a photosensitive agent at step 15 (resist treatment). The circuit pattern is printed on the wafer by exposure at step 16 (exposure) using the exposure apparatus described above. The exposed wafer is developed at step 17 (development) and portions of the wafer other than those having the developed resist image are etched away at step 18 (etching). The unnecessary resist left after etching is removed at step 19 (resist removal). Repeating these steps forms multiple circuit patterns on the wafer.

If the method of manufacture according to this embodiment is used, a semiconductor device having a high degree on integration, which is difficult to manufacture conventionally, can be manufactured at low cost.

In accordance with the present invention, as described above, it is possible to provide a multi-electronic beam electron beam exposure apparatus in which the patterns exposed by the electron beams can be connected with a high degree of reliability.

The present invention is not limited to the above embodiments and various changes and modifications can be made within the spirit and scope of the present invention. Therefore, to apprise the public of the scope of the present invention, the following claims are made.

What is claimed is:

1. An electron beam exposure apparatus comprising a plurality of electron beam sources for irradiating a substrate with electron beams, displacing means for displacing irradiation positions of the electron beams which irradiate the substrate, and irradiation control means for individually controlling the irradiation of the substrate by the plurality of electron beams, said displacing means displacing the irradiation position of each electron beam in such a manner that a peripheral portion of an element exposure area corresponding to each electron beam source will overlap a peripheral portion of another element exposure area contiguous thereto.

2. The apparatus according to claim 1, wherein said displacing means includes deflecting means for deflecting the electron beam, which irradiates the substrate, from each electron beam source.

3. The apparatus according to claim 1, wherein the element exposure areas are rectangular in shape, and said displacing means scans the interior of each element exposure area by the corresponding electron beam.

4. The apparatus according to claim 2, wherein the element exposure areas are rectangular in shape, and said deflecting means deflects each electron beam in such a manner that the interior of each element exposure area is scanned by the corresponding electron beam.

5. The apparatus according to claim 1, wherein said irradiation control means controls, in dependence upon the number of overlapping element exposure areas, an amount of irradiation by the electron beam from each electron beam source that corresponds to each element exposure area, this control being performed at an overlap area in which two or more element exposure areas overlap.

6. The apparatus according to claim 1, wherein said irradiation control means controls an amount of irradiation by the electron beam from each electron beam source that corresponds to each element exposure area in dependence upon a distance from a boundary of the particular element exposure area, this control being performed at an overlap area in which element exposure areas overlap.

7. The apparatus according to claim 1, wherein a width of an overlap area in which the peripheral portion of an element exposure area overlaps the peripheral portion of another element exposure area is decided based upon displacement accuracy of said displacing means.

8. The apparatus according to claim 2, wherein said deflecting means includes:

main deflecting means for deflecting each electron beam in such a manner that subfields are changed over in successive fashion, wherein a subfield is an exposure area constructed by joining a plurality of element exposure areas; and auxiliary deflecting means for deflecting each electron beam in such a manner that the interior of each element exposure area constructing a subfield is scanned by the corresponding electron beam;

wherein whenever exposure of a subfield that is the object of exposure is finished, a changeover to the next subfield is performed by said main deflecting means and this subfield is exposed, whereby all exposure areas on the substrate are exposed.

9. The apparatus according to claim 8, wherein a width of an overlap area in which an element exposure area situated at the outer periphery of a subfield overlaps an element exposure area situated at the outer periphery of another subfield is larger than a width of an overlap area at which element exposure areas overlap each other within a subfield.

10. The apparatus according to claim 8, wherein said irradiation control means controls, in dependence upon the number of overlapping element exposure areas, an amount of irradiation by the electron beam from each electron beam source that corresponds to each element exposure area, this control being performed at an overlap area in which two or more element exposure areas overlap.

11. The apparatus according to claim 8, wherein said irradiation control means controls an amount of irradiation by the electron beam from each electron beam source that corresponds to each element exposure area in dependence upon a distance from a boundary of the particular element exposure area, this control being performed at an overlap area in which element exposure areas overlap.

12. The apparatus according to claim 1, further comprising generating means for generating exposure control data, which individually controls exposure of each element exposure area, based upon pattern data describing a pattern to be exposed on the substrate, exposure being controlled by supplying the exposure control data to said displacing means and said irradiation control means.

13. The apparatus according to claim 12, wherein said generating means generates the exposure control data upon partitioning the pattern into element exposure areas, based upon pattern data, in such a manner that element exposure areas will have overlapping areas.

14. A method of manufacturing a device using the electron beam exposure apparatus described in claim 1.

15. A method of controlling an electron beam exposure apparatus having a plurality of electron beam sources for irradiating a substrate with electron beams, and displacing means for displacing irradiation positions of the electron beams which irradiate the substrate, said method comprising:

an irradiation control step of individually controlling the irradiation of the substrate by the plurality of electron beams; and a displacement control step of causing said displacing means to displace the irradiation position of each electron beam in such a manner that a peripheral portion of an element exposure area corresponding to each electron beam source will overlap a peripheral portion of another element exposure area contiguous thereto;

the substrate being exposed by executing said irradiation control step and said displacement control step in cooperative fashion.

16. The method according to claim 15, wherein said displacing means includes deflecting means for deflecting the electron beam, which irradiates the substrate, from each electron beam source;

said displacement control step including a deflection control step of controlling said deflecting means.

17. The method according to claim 15, wherein the element exposure areas are rectangular in shape, said displacing means being controlled at said displacement control step in such a manner that the interior of each element exposure area is scanned by the corresponding electron beam.

18. The method according to claim 16, wherein the element exposure areas are rectangular in shape, and each electron beam is deflected at said deflection control step in such a manner that the interior of each element exposure area is scanned by the corresponding electron beam.

19. The method according to claim 15, wherein a amount of irradiation by the electron beam from each electron beam source that corresponds to each element exposure area is controlled at said irradiation control step in dependence upon the number of overlapping element exposure areas, this control being performed at an overlap area in which two or more element exposure areas, overlap.

20. The method according to claim 15, wherein a amount of irradiation by the electron beam from each electron beam source that corresponds to each element exposure area is controlled at said irradiation control step in dependence upon a distance from a boundary of the particular element exposure area, this control being performed at an overlap area in which element exposure areas overlap.

21. The method according to claim 15, wherein a width of an overlap area in which the peripheral portion of an element exposure area overlaps the peripheral portion of another element exposure area is decided based upon displacement accuracy of said displacing means.

22. The method according to claim 16, wherein said deflecting means includes:

main deflecting means for deflecting each electron beam in such a manner that subfields are changed over in successive fashion, wherein a subfield is an exposure area constructed by joining a plurality of element exposure areas; and auxiliary deflecting means for deflecting each electron beam in such a manner that the interior of each element exposure area constructing a subfield is scanned by the corresponding electron beam;

wherein whenever exposure of a subfield that is the object of exposure is finished, said irradiation control step and said displacement control step control, in cooperating fashion, an operation of performing a changeover to the next subfield by said main deflecting means and exposing this subfield, whereby all exposure areas on the substrate are exposed.

23. The method according to claim 22, wherein said deflecting means is controlled at said deflection control step in such a manner that a width of an overlap area in which an element exposure area situated at the outer periphery of a subfield overlaps an element exposure area situated at the outer periphery of another subfield becomes larger than a width of an overlap, area at which element exposure areas overlap each other within a subfield.

24. The method according to claim 22, wherein an amount of irradiation by the electron beam from each electron beam source that corresponds to each element exposure area is controlled at said irradiation control step in dependence upon the number of overlapping element exposure areas, this control being performed at an overlap area in which two or more element exposure areas overlap.

25. The method according to claim 22, wherein an amount of irradiation by the electron beam from each electron beam source that corresponds to each element exposure area is controlled at said irradiation control step in dependence upon a distance from a boundary of the particular element exposure area, this control being performed at an overlap area in which element exposure areas overlap.

26. The method according to claim 15, further comprising a generating step of generating exposure control data, which individually controls exposure of each element exposure area, based upon pattern data describing a pattern to be exposed on the substrate, exposure being controlled by supplying the exposure control data to said displacement control step and said irradiation, control step.

27. The method according to claim 15, wherein the exposure control data is generated at said generating step by partitioning the pattern into element exposure areas, based upon pattern data, in such a manner that element exposure areas will have overlapping areas.

28. A method of manufacturing a device while controlling an electron beam exposure apparatus using the method of control described in claim 15.

29. A computer readable program for controlling an electron beam exposure apparatus having a plurality of electron beam sources for irradiating a substrate with electron beams, and displacing means for displacing irradiation positions of the electron beams which irradiate the substrate, said program comprising:

an irradiation control step of individually controlling the irradiation of the substrate by the plurality of electron beams; and a displacement control step of causing said displacing means to displace the irradiation position of each electron beam in such a manner that a peripheral portion of an element exposure area corresponding to each electron beam source will overlap a peripheral portion of another element exposure area contiguous thereto.

30. The program according to claim 29, further comprising a generating step of generating exposure control data, which individually controls exposure of each element exposure area, based upon pattern data describing a pattern to be exposed on the substrate, exposure being controlled by supplying the exposure control data to said displacement control step and said irradiation control step.

31. The program according to claim 30, wherein the exposure control data is generated at said generating step by partitioning the pattern into element exposure areas, based upon pattern data, in such a manner that element exposure areas will have overlapping areas.

32. A computer readable program for generating exposure control data for controlling an exposure operation by an electron beam exposure apparatus having a plurality of electron beam sources for irradiating a substrate with electron beams, displacing means for displacing irradiation positions of the electron beams which irradiate the substrate, and irradiation control means for individually controlling the irradiation of the substrate by the plurality of electron beams, said program comprising:

a step of entering parameter data describing a pattern to be exposed on the substrate; and a step of generating exposure control data for partitioning a pattern into element exposure areas and individually controlling exposure of each of the element exposure areas.

* * * * *

UNITED STATES PATENT AND TRADEMARK OFFICE
CERTIFICATE OF CORRECTION

PATENT NO. : 5,905,267

DATED : May 18, 1999

INVENTORS : MASATO MURAKI

It is certified that error appears in the above-identified patent and that said Letters Patent is hereby corrected as shown below:

COLUMN 1:

line 8, "directly" should read --directly,--; and
    line 18, "cross sectional" should read --cross-sectional--.

COLUMN 6:

line 20, "sub deflector" should read --sub-deflector--;
    line 22, "sub deflector" should read --sub-deflector--; and
    line 56, "D(5,5)" should read --to D(5,5)--.

COLUMN 8:

line 10, "blanking" should read --A blanking--; and
    line 25, "System" should read --system--.

COLUMN 14:

line 14, "on" should read --of--.

UNITED STATES PATENT AND TRADEMARK OFFICE
CERTIFICATE OF CORRECTION

PATENT NO. : 5,905,267
DATED : May 18, 1999
INVENTORS : MASATO MURAKI

It is certified that error appears in the above-identified patent and that said Letters Patent is hereby corrected as shown below:

COLUMN 16:

```
line 6,  "source;" should read --source; and--;
line 20, "a" should read --an--;
line 27, "a" should read --an--;
line 50, "beam;" should read --beam,--; and
line 64, "overlap," should read --overlap--.
```

COLUMN 17:

```
line 20, "claim 15," should read --claim 26,--.
```

Signed and Sealed this

Fifth Day of September, 2000

Q. TODD DICKINSON

*Attest:*

*Attesting Officer*     Director of Patents and Trademarks